(12) United States Patent
Cowburn et al.

(10) Patent No.: US 7,710,770 B2
(45) Date of Patent: May 4, 2010

(54) DATA STORAGE DEVICE AND METHOD

(75) Inventors: Russell Paul Cowburn, Gerrards Cross (GB); Dorothee Petit, London (GB); Dan Read, London (GB); Oleg Petracic, Oberhausen (DE)

(73) Assignee: Ingenia Holdings UK Limited, London (GB)

( * ) Notice: Subject to any disclaimer, the term of this patent is extended or adjusted under 35 U.S.C. 154(b) by 523 days.

(21) Appl. No.: 11/745,773

(22) Filed: May 8, 2007

(65) Prior Publication Data

US 2007/0262301 A1   Nov. 15, 2007

Related U.S. Application Data

(60) Provisional application No. 60/746,839, filed on May 9, 2006.

(51) Int. Cl.
*G11C 11/15* (2006.01)

(52) U.S. Cl. .................. 365/173; 365/171; 365/158; 365/81; 365/90; 365/225.5; 438/3; 977/933

(58) Field of Classification Search ............... 365/48, 365/66, 78, 80–87, 100, 148, 158, 171, 173, 365/225.5, 243.5; 216/22; 257/40, 421, 257/E21.665; 438/3; 977/933–935
See application file for complete search history.

(56) References Cited

U.S. PATENT DOCUMENTS

2004/0251232 A1 * 12/2004 Chen et al. ............... 216/22

(Continued)

FOREIGN PATENT DOCUMENTS

EP    1630819    3/2006

(Continued)

OTHER PUBLICATIONS

Lepadatu, S., et al., "Current Induced Magnetisation Switching in Asymmetric Necked Wires," Spintronics Laboratory, Department of Electronics, p. 76, The University of York, United Kingdom.

(Continued)

*Primary Examiner*—Son Dinh
*Assistant Examiner*—Harry W Byrne
(74) *Attorney, Agent, or Firm*—McDonnell Boehnen Hulbert & Berghoff LLP

(57) ABSTRACT

A serial magnetic mass storage device and associated data storage method of the kind in which data is encoded in single magnetic domains in nanowires. In the invention, the nanowires are provided with a large number of notches along their length to form domain wall pinning sites. Moreover, the notches are addressed in groups (A, B, C) by heating electrodes. By alternately heating the notches hosting head-to-head and tail-to-tail domain walls in synchrony with alignment and anti-alignment of an operating field (H) along the nanowire the magnetic domains are moved along the nanowire by alternate movement of the head-to-head and tail-to-tail domain walls in caterpillar or worm-like motion in which the domains are incrementally lengthened and shortened by one inter-notch distance as they move along the nanowires under the joint coordinated action of the heating and alternating operating field. From an interconnect and fabrication standpoint, the scheme can be scaled almost without restriction out of the plane of the substrate to provide hundreds or thousands of stacked layers of nanowires, thus allowing very dense three-dimensional networks of stored information to be realised.

30 Claims, 18 Drawing Sheets

U.S. PATENT DOCUMENTS

| | | | | |
|---|---|---|---|---|
| 2004/0252538 | A1* | 12/2004 | Parkin | 365/80 |
| 2004/0252539 | A1* | 12/2004 | Parkin | 365/80 |
| 2005/0078509 | A1* | 4/2005 | Parkin | 365/158 |
| 2005/0078511 | A1* | 4/2005 | Parkin | 365/171 |
| 2005/0094427 | A1* | 5/2005 | Parkin | 365/80 |
| 2005/0186686 | A1* | 8/2005 | Chen et al. | 438/3 |
| 2006/0120132 | A1* | 6/2006 | Parkin | 365/80 |

FOREIGN PATENT DOCUMENTS

| | | |
|---|---|---|
| EP | 1821311 | 8/2007 |
| EP | 1826771 | 8/2007 |
| WO | WO2004077451 | 9/2004 |

OTHER PUBLICATIONS

Menendez, J.L., et al. "Asymmetric Motion of an Exchange-Biased Magnetic Domain Wall in Magnetic Wires," Institut d'Electronique Fondamentale, Universite Paris, p. 819, France.

Koike, et al., "Magnetization Reversal with Domain-Wall Pinning in (Ga, Mn) as Wire," Department of Innovative and Engineered Materials, Tokyo Institute of Technology, Oct. 2005, pp. 2742-2744, vol. 41, No. 10, IEEE Transactions on Magnetics, Japan.

Atkinson, et al., "Magnetic Domain Wall Dynamics in a Permalloy Nanowire," Department of Physics, University of Durham, Sep. 2003, pp. 2663-2665, vol. 39, No. 5, IEEE Transactions on Magnetics, United Kingdom.

Xiaobin, et al., "Spatially Resolved Observation of Domain-Wall Propagation in a Submicron Ferromagnetic NOT-gate," Department of Physics, University of Alberta, Aug. 2005, Applied Physics Letters 87, 062503, Canada.

Cowburn, et al., "Domain Wall Injection and Propagation in Planar Permalloy Nanowires," Department of Physics, University of Durham, May 15, 2002, pp. 6949-6951, vol. 91, No. 10, Journal of Applied Physics, United Kingdom.

Faulkner, et al., "Artificial Domain Wall Nanotraps in Ni81, Fe19 Wires," Department of Physics, University of Durham, Jun. 1, 2004, pp. 6717-6719, vol. 95, No. 11, Journal of Applied Physics, United Kingdom.

Allwood, et al., "Magnetic Domain-Wall Logic," Department of Engineering Materials, University of Sheffield, Sep. 9, 2005, vol. 309, Science, United Kingdom.

Allwood, et al., "Magneto-Optical Kerr Effect Analysis of Magnetic Nanostructures," Department of Physics, University of Durham, Sep. 3, 2003, pp. 2175-2182, Institute of Physics Publishing, United Kingdom.

Klaui, et al., "Domain Wall Pinning in Narrow Ferromagnetic Ring Structures Probed by Magnetoresistance Measurements," Cavendish Laboratory, University of Cambridge, Mar. 7, 2003, vol. 90, No. 9, Physical Review Letters, United Kingdom.

McMichael, et al., "Head to Head Domain Wall Structures in Thin Magnetic Strips," National Institute of Standards and Technology, Jan. 30, 1997, U.S. Government, United States.

Porter, et al., "Velocity of Transverse Domain Wall Motion Along Thin, Narrow Strips," National Institute of Standards and Technology, Jun. 1, 2004, pp. 6729-6731, vol. 95, No. 11, Journal of Applied Physics, United States.

Cowburn, R.P., Digital Logic Using Magnetic Nanostructures, IEEE, 2005, pp. 249-252, France.

McMichael, R.D. et al., Domain Wall Traps for Low-Field Switching of Submicron Elements, Journal of Applied Physics, May 1, 2000, pp. 7058-7060, vol. 87, No. 9.

Yamaguchi, A. and Nasu, S. et al., Effect of Joule Heating in Current-Driven Domain Wall Motion, Applied Physics Letters, 2005.

Method for the Preparation of Lateral Superlattices, IBM Technical Disclosure Bulletin, Apr. 1997, pp. 61-65, vol. 40, No. 4.

Allwood, D.A., Domain Wall Diodes in Ferromagnetic Planar Nanowires, Applied Physics Letters, Oct. 4, 2004, pp. 2848-2850. vol. 85, No. 14.

* cited by examiner

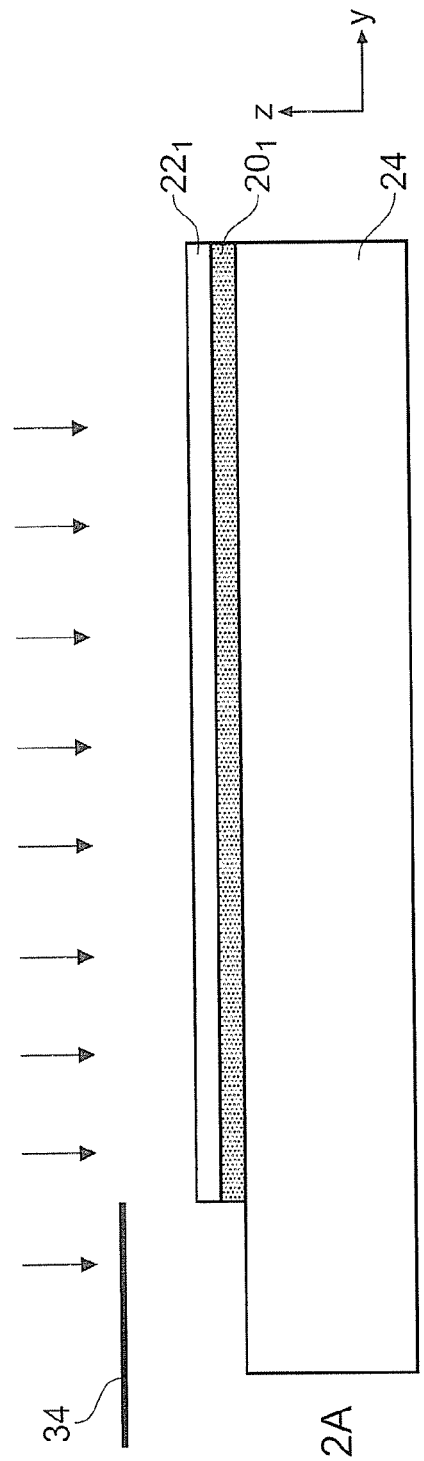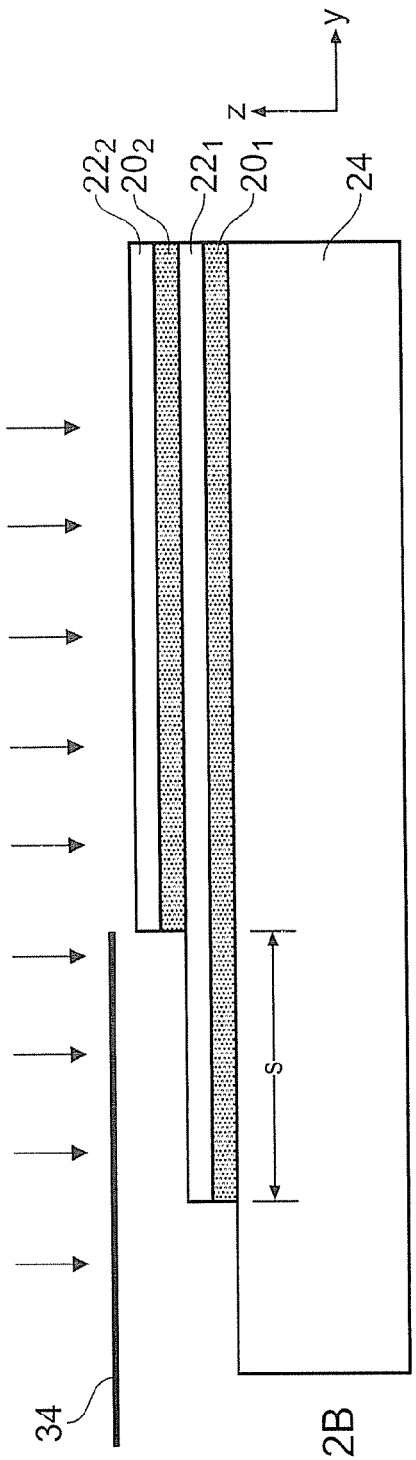

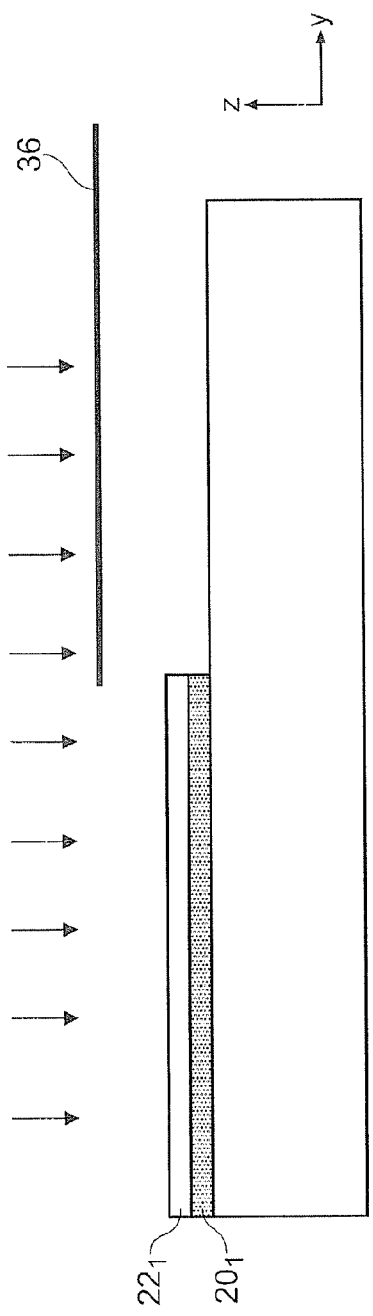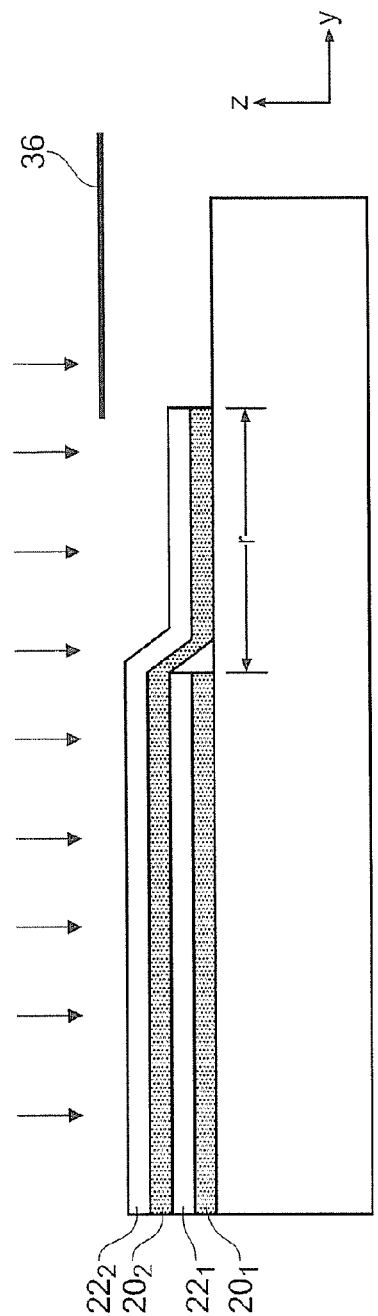

DATA STORAGE DEVICE AND METHOD

RELATED APPLICATIONS

This application claims priority to and incorporates by reference U.S. provisional application No. 60/746,839 filed on May 9, 2006.

FIELD OF THE INVENTION

The present invention relates to data storage, more especially but not exclusively to mass storage memory devices capable of storing GBytes of data, and of storing data at high densities.

Hard drives with magnetic disks are the dominant technology for mass data storage and retrieval in personal computers (PCs). With current technology hard disk drives have storage capacities of up to around 100-200 GBytes, although smaller capacity miniature units are used in some devices, such as portable music players, video players and other portably multimedia devices which typically have drive capacities in the range 30-40 GBytes, or even smaller devices for digital cameras of sub-10 GBytes. The basic structure of a hard drive can trace its heritage back to a 19th century gramophone, in that it is fundamentally a mechanical device based on a spinning disk with a pivotally mounted arm that can be positioned over the disk to read (and write) data stored on the disk in generally circular tracks. Optical storage devices, such as CD and DVD read/write devices, adopt a similar construction at a basic level in that a spinning disk (whose storage mechanism may be based on a variety of physical mechanisms) is accessed optically using a head that emits a laser beam downwardly onto the disk.

There is general recognition that it would be desirable to dispense with hard drives and other spinning-disk based devices in that they are the last truly mechanical components in a personal computer and other devices that have multi-GByte mass storage requirements. Spinning disk systems suffer from unreliability of the mechanical components (such as the disk bearings), cannot be miniaturised well, and cannot be used in high vibration or high shock environments. All require an ultra-flat disk surface to which the head has access to the surface. Any contamination of the surface through dust particles or other foreign bodies or warping or other non-flatness of the surface can result in failure to read/write or catastrophic failure of the device by crashing of the head. Moreover, access times are of a mechanical time scale and in a PC severely limit the microprocessor's performance. It is estimated that in a PC up to one third of the instruction cycles of a microprocessor can be wasted by waiting for the hard disk.

Non-volatile serial memory based on semiconductor integrated circuits continues to develop strongly in terms of reduced cost and increased capacity. (Serial memory that stores data serially, i.e. filewise, and is thus suitable for file storage, is to be contrasted with Random Access Memory (RAM) which stores data individually, i.e. bitwise, and is thus suitable to high speed access of small data segments, such as for processing operations.) Serial semiconductor memory is typically some form of EEPROM (Electrically Erasable Programmable Read-Only Memory). Flash memory is the non-volatile semiconductor memory of choice, being used widely in devices such as USB memory sticks, CF/SD memory cards for digital cameras, mobile phones and MP3 players. However, with current technology semiconductor memory is still too costly to displace hard drives. Moreover, such memories suffer from problems associated with limited write endurance and write latency. In particular, flash memory has a life cycle of up to approximately 1000 write operations before degradation of reliability and performance occurs. Also, the write latency for flash memory is high due to the need to charge a large capacitance for the data storage. Additionally, flash memory has a storage density limit of approximately 40 Mbit/$mm^2$ (approximately 25 Gbit/$in^2$).

By way of concrete example, today's flash chips store data at an areal density of around 15 Gbits/square inch. ULSI chips cost about $100 per square inch to manufacture, so the cost per bit of flash memory is about 1 micro-cent. In comparison, today's hard drives cost about $100 to manufacture and this does not change much with the storage capacity, so a large PC disk drive, a smaller laptop disk drive or a small form-factor drive for a digital camera all cost roughly the same. For a PC disk drive of 100 GBytes, the cost per bit is thus 0.01 microcents, i.e. about 100 times cheaper than flash memory. On the other hand, a miniature disk drive for a camera of say 2 GBytes will have a cost per bit of about 1 microcent, i.e. the same as flash memory. The commercial trade-off between flash memory and hard drives is most obvious in the MP3 player market where smaller capacity players are based on flash memory and larger capacity players are based on hard drives.

As well as cost per bit, another key parameter for mass data storage devices is density of information. Both disk drives and flash memory have important limitations in the density of information that they can store by today's state-of-the-art lithography. In the case of flash memory, lithography defines the basic storage cell; a typical cell is roughly $10F^2$ in area, where F is the minimum feature size that can be produced by the generation of lithography in use (90 nm today, soon 65 nm). In the case of a hard disk drive, lithography is used to define the gap in the write head which defines how well focused the writing magnetic field is, and hence the smallest bit size that can be written. Storage densities of both of these technologies will thus be unable to make order of magnitude leaps without a sudden (and unexpected) change in lithography performance.

A step-increase in data storage densities is highly desirable for several reasons.

Firstly, consumers and computer applications can always use more memory. Secondly, as mobile devices such as PDAs (personal digital assistants) and mobile phones become for advanced (e.g. 3G video streaming etc) there is a need to give the volumes of file storage space usually associated with laptops and desktop computers to very small devices. This miniaturisation can only be achieved with very high density memory. Thirdly, the only reason that the hard disk persists is that the cost per bit of stored data is 100 times lower than the semiconductor equivalent (e.g. flash or battery-backed DRAM). To give a computer 100 GB of file storage (a typical hard disk capacity) using flash memory would cost around $10,000 at today's prices. Because lithography can't be improved by a factor of 10-100 in the short term, a different solution for increasing storage density is required.

Our view is that the only way to increase storage density by orders of magnitude with current lithography is to move away from 2-dimensional devices to 3-dimensional devices. This allows the total amount of information stored to be increased without reducing the minimum feature size of the lithography. However, the only approach to 3-dimensional solid state memory available at the moment is simply to layer devices on top of each other, each layer requiring electrical connection. The number of process steps in the manufacturing route therefore increases with the number of layers, and since the manufacturing cost is determined partly by the number of process steps, the actual cost per bit would not fall.

What is needed is a way of remotely reading and writing bits from a 3-dimensional (3D) volume of data storage so that electrical connections (and hence process steps) do not have to be made for each part of the volume.

Magneto-electric devices have the potential to fulfil this requirement, since they are (i) non-volatile and (ii) can be acted upon by magnetic fields, which can be created and sensed at a distance. Magneto-electric devices for data storage that have been proposed can broadly be classified into two classes: single domain devices and domain wall devices. Single domain devices, such as magnetic RAM cells, attempt to keep all of the spins within a device element tightly locked together. Domain wall devices use manipulation of the location of the domain wall itself to signify different data states.

One kind of 3D magnetic memory device has been developed by Parkin and Chen at International Business Machines Corporation (IBM) [1-6]. This magnetic memory device is based on ferromagnetic nanowires which are referred to by this group as data tracks or race tracks. Specifically, it uses domain walls in the nanowires to encode data serially in a plurality of alternately directed single domains along the nanowires. The device uses spin-based electronics to write and read data. An electric current is applied to the nanowires to move the magnetic domains along the track in the direction of the electric current, past reading or writing elements. The electric current passed across the domain wall acts to move the domain walls in the direction of the current flow. As the current passes through a domain, it becomes "spin polarised". When this spin-polarised current passes into the next domain across a domain wall, it develops a spin torque. This spin torque moves the domain wall. The key breakthrough of this design is that the spin polarisation effect allows both head-to-head and tail-to-tail domain walls to be moved in the same direction along the nanowire to shift the data encoded by the domains along the nanowire in a kind of pipeline. However, as well as being a breakthrough, using this spin-polarisation effect is at the same time a serious limitation for any device based on this principle. This is because the current-induced propagation along the nanowire of the head-to-head and tail-to-tail domain walls needs to be under complete control, since if adjacent head-to-head and tail-to-tail domain walls do not propagate at near equal speed, they will come together and annihilate, thereby corrupting the data encoded by the domains. For example, any inhomogeneity along the nanowires may affect the propagation speed of the domain walls leading to differential motion between adjacent domain walls. To achieve the necessary control of the propagation speed in such devices will become increasingly challenging from a fabrication point of view as such devices is scaled up from a prototype stage to a production device. Consequently, in our view at least, it is by no means certain that this type of device can successfully be developed into a commercial product.

Recent research on domain wall devices from our group and others is now discussed in more detail. The nucleation and propagation properties of domain walls in nanoscale wires have been studied [7-11]. In particular it has been shown that nanostructures can be made in which the (threshold) domain wall nucleation field is significantly higher than the (threshold) domain wall propagation field. With this approach nanowires can be fabricated with a nucleation field of about 200 Oersted (Oe) and a propagation field of only about 3 Oe. This means that that domain walls can be propagated within the nanostructures using appropriate drive fields having a magnitude between the propagation field and the nucleation field without causing additional domain walls to be nucleated. Moreover, new domain walls can be selectively nucleated in a controlled manner in localised parts of the nanostructure by applying a local field having a magnitude greater than the nucleation field. Consequently, nanostructures have been demonstrated in which domain walls are nucleated (i.e. created), moved and annihilated in a controlled, stable and reproducible manner. The presence (or absence) of domain walls can be sensed at localised parts of the nanostructure using a suitable sensor, such as a magneto-optical Kerr effect (MOKE) device [11] or an anisotropic magneto resistance (AMR) device [12].

We have demonstrated how domain walls can be exploited to fabricate a data storage device [8, 10] in which a logical NOT gate function can be achieved by providing a nanowire section that follows a cycloid path. By repeating these cycloids along a nanowire, a data storage pipe can be fabricated that operates as a serial memory device.

We have further shown [8, 9] that the position of a domain wall in a nanowire can be controlled using traps which serve to pin the domain wall. A corner is used as one form of trap and a wedge-shaped notch is used as another form of trap [9]. These traps provide a localised increase in the threshold propagation field. By applying a field greater than the propagation field for the nanowire and less than the local propagation field for the trap, a domain wall can be moved along the wire and into the trap where it will remain pinned. The domain wall can then be depinned and moved along the wire again by increasing the field beyond the local propagation field for the trap.

Building on our prior research, it is an object of this invention to provide a data storage device and method based on domain wall manipulation that is capable of scaling to mass storage at high density.

SUMMARY OF THE INVENTION

According to the invention there is provided a serial data storage device comprising: a substrate; an array of nanowires of magnetic material arranged in three-dimensions on the substrate, wherein the nanowires extend in the y-direction and are spaced apart from each other in the x-and z-directions forming a stack of nanowire layers, wherein each nanowire is formed so as to be capable of supporting single magnetic domains along its length, the magnetic domains being separated by domain walls, wherein the nanowires have a plurality of domain wall pinning sites along their length; a magnetic field source arranged to generate an operating field capable of moving the domain walls along the nanowires between the pinning sites by action of a component that alternates between alignment and anti-alignment with a first direction along the nanowire; and a depinning signal generator arranged to alternately apply a depinning signal to pinning sites hosting head-to-head and tail-to-tail domain walls in synchrony with the alignment and anti-alignment of the operating field component with the first direction, thereby to move magnetic domains along the nanowire in the first direction by alternate movement of the head-to-head and tail-to-tail domain walls.

With this device, information can be moved down a magnetic nanowire by a combination of external magnetic fields and locally applied pulses of energy, such as heat energy. The scheme can be scaled almost indefinitely in the z (out of plane) direction, thus allowing very dense 3D networks of stored information to be realised. All data reading and writing activity can be performed with a single overlayer and with the base level of the CMOS (complementary metal oxide semiconductor) or other integrated circuit basis, so there is no need to make multilayered electrical connections to the different z stacked storage layers. Importantly, the multiple storage layers can all use the same mask or other lithography design, and so can be made by a single lithographic step; different layers are defined by a superlattice-like deposition, i.e. a layer of magnetic material is deposited followed by a layer of non-magnetic material as a spacer, followed by a further layer of magnetic material etc), all with a single lithographic exposure. These two points mean that the manufacturing cost does not scale with the number of layers; all that changes is the time taken for the deposition, which adds only a small marginal cost.

The domain wall pinning sites can be created in a variety of ways, for example by dimensional variations along the nanowires, such as local narrowing or widening features in the nanowires to create inward or outward notches.

A plurality of nucleation field generators is preferably provided, one for each nanowire, arranged to selectively create new magnetic domains in the nanowires by locally applying a field of at least the nucleation field at a read-in location.

The device may have a data input side formed by a plurality of terraces extending in the x-direction formed by stepwise termination of each nanowire layer. The nanowire layer that terminates to form each terrace on the input side can in each case be the lowermost nanowire layer or the uppermost nanowire layer.

A plurality of magnetic field detectors is preferably provided, one for each nanowire, arranged to measure the magnetic field of the nanowires at a read-out location.

The device may have a data output side formed by a plurality of terraces extending in the x-direction formed by stepwise termination of each nanowire layer. The nanowire layer that terminates to form each terrace on the output side can in each case be the lowermost nanowire layer or the uppermost nanowire layer.

It is preferred for ease of fabrication that the termination type on the output side is complementary to the termination type on the input side, so that one side has uppermost terminations and the other side lowermost terminations. Moreover, for ease of fabrication it is also preferred if the data input and output side terraces associated with the same nanowire layer have the same extent in the y-direction.

The invention further provides a method of serially storing data encoded in magnetic domains in a nanowire, each magnetic domain being bounded by a head-to-head domain wall and a tail-to-tail domain wall, and the nanowire having a plurality of domain wall pinning sites along its length, the method comprising: (a) applying an operating field having a component that alternates between alignment and anti-alignment with a first direction along the nanowire; and (b) alternately applying a depinning energy to pinning sites hosting head-to-head and tail-to-tail domain walls in synchrony with the alignment and anti-alignment of the operating field component with the first direction, so that the magnetic domains are moved along the nanowire in the first direction by alternate movement of the head-to-head and tail-to-tail domain walls.

The method preferably further comprises: (c) selectively creating new magnetic domains in the nanowire by locally applying a field of at least the nucleation field at a read-in location, while carrying out steps (a) and (b), thereby reading in data serially into the nanowire in the first direction. The read-in location is preferably at an end portion of the nanowire associated with the nanowire end away from which the domain walls are moved in the first direction.

The method preferably further comprises: (d) repeatedly measuring the magnetic field of the nanowire at a read-out location, while carrying out steps (a) and (b), thereby reading out data serially from the nanowire in the first direction. The read-out location is preferably at an end portion of the nanowire associated with the nanowire end towards which the domain walls are moved in the first direction.

It is also possible to shift data in the nanowires in the reverse direction if desired. Accordingly, the method may further comprise:

(e) alternately applying a depinning energy to pinning sites hosting head-to-head and tail-to-tail domain walls in synchrony with the anti-alignment and alignment of the operating field component with the first direction, so that the magnetic domains are moved along the nanowire in a second direction, opposite to the first direction, by alternate movement of the head-to-head and tail-to-tail domain walls.

In an alternative embodiment, the data can be read out the same end as it is inputted thereby providing a FILO (first in last out) storage method in contrast to the FIFO (first in first out) storage method achieved when the data is input at one end of the nanowire and output at the other. Namely, the method may further comprise: (f) repeatedly measuring the magnetic field of the nanowire at a read-out location, while carrying out steps (a) and (e), thereby reading out data serially from the nanowire in the second direction. In this case, the read-out location is at a nanowire end towards which the domain walls are moved in the second direction.

The presently preferred implementation for applying the depinning energy is by electrically induced heating, typically using heating electrodes that pass close to the pinning sites, although in principle other forms of energy could be used such as optical.

According to a further aspect of the invention there is provided a method of injecting, storing and reading out serial data streams using nanowires of magnetic material capable of supporting single magnetic domains along their length, wherein the nanowires have a plurality of domain wall pinning sites along their length, each nanowire being formed so that a domain wall is mobile along the nanowire under action of an operating field having a strength between the propagation field for the nanowire and a locally enhanced propagation field at the pinning sites, the method comprising: applying the operating field to render domain walls mobile in the nanowire between adjacent pinning sites, wherein the nanowire is activated while the operating field is being applied (and is deactivated and non-volatile otherwise); selectively injecting domain walls into the nanowire at an injection location by applying a local magnetic field of at least the nucleation field at the injection location, wherein the domain walls or the magnetic domains defined by them are used to encode data; moving the injected domain walls along the nanowire away from the injection location in a stepwise fashion from one pinning site to the next by applying depinning energy to selected ones of the pinning sites while the nanowire is activated so as to temporarily lower the locally enhanced propagation field at the selected pinning sites to below the operating field; and measuring magnetic field of the nanowire at least one read location on the nanowire to read the data encoded by the domains or domain walls.

Particular and preferred aspects and embodiments are also set out in the appended claims.

Definitions

Domain wall: an interface between magnetic domains of oppositely aligned magnetisation.

Transverse domain wall: a domain wall in which the magnetisation is predominantly aligned in a single direction in the plane of the domain wall. In a typical magnetic nanowire which is much wider (horizontal dimension) than it is thick (vertical dimension), the magnetisation alignment will be in one of two states aligned or anti-aligned with the long dimension of the cross-section [13]. These two states are referred to as states of 'up' and 'down' chirality. Transverse domain walls will tend to form in smaller cross-section nanowires [13].

Vortex domain wall: a domain wall in which the magnetisation forms a vortex or spiral pattern at the domain wall. Vortex domain walls will have a clockwise or counter-clockwise orientation of their magnetization patterns in plan view, these two states being referred to as clockwise or counter-clockwise chirality [13]. Vortex domain walls will tend to form in larger cross-section nanowires [13].

Head-to-head domain wall: a domain wall between "north" ends or heads of adjacent magnetic domains generally associated with a positive magnetostatic charge accumulation.

Tail-to-tail domain wall: a domain wall between "south" ends or tails of adjacent magnetic domains generally associated with a negative magnetostatic charge accumulation.

Nanowire: a domain wall conduit made of magnetic material having sufficient shape anisotropy that magnetisation aligns with the longitudinal axis of the nanowire. Typically made of soft magnetic material such as Permalloy ($Ni_{80}Fe_{20}$). Typically having a width in the submicron range, such as less than 0.2 μm (200 nm), more especially a width of the order of what is achievable with conventional lithography (currently 90 nm, soon to be 65 nm, but ever reducing).

Domain nucleation field: a threshold field, being the minimum field that need be applied to reverse magnetisation in a nanowire if no reverse domain already exists in the wire.

Domain propagation field: a threshold field, being the minimum field that need be applied to move a domain wall along a nanowire.

Domain wall pinning site: a location along a nanowire at which the nanowire has a locally enhanced propagation field caused by a pre-fabricated (i.e. not naturally occurring) modulation of the energy of a domain wall present at that location.

Depinning field: the locally enhanced domain propagation field needed to render domain walls mobile across (and out of) pinning sites.

Operating field: a field having a strength between the propagation field and the depinning field.

Depinning energy: the energy that needs to be applied to a pinning site to temporarily lower the locally enhanced propagation field to below the operating field.

Inward notch: a type of domain wall pinning site created by a local narrowing of a nanowire.

Outward notch: a type of domain wall pinning site created by a local widening of a nanowire.

Notch: an inward or outward notch.

It will be understood that references to "field", such as operating field and so forth, in most cases mean a magnetic field having a substantial component in the plane of the nanowires for manipulating domain walls.

BRIEF DESCRIPTION OF THE FIGURES

Specific embodiments of the present invention will now be described by way of example only with reference to the accompanying figures in which:

FIGS. 12A and 12B are schematic side section views showing fabrication of an input side of a memory device embodying the invention in the yz plane; and FIGS. 13A and 13B are schematic side section views showing fabrication of an output side of a memory device embodying the invention in the yz plane;

Figure 1:
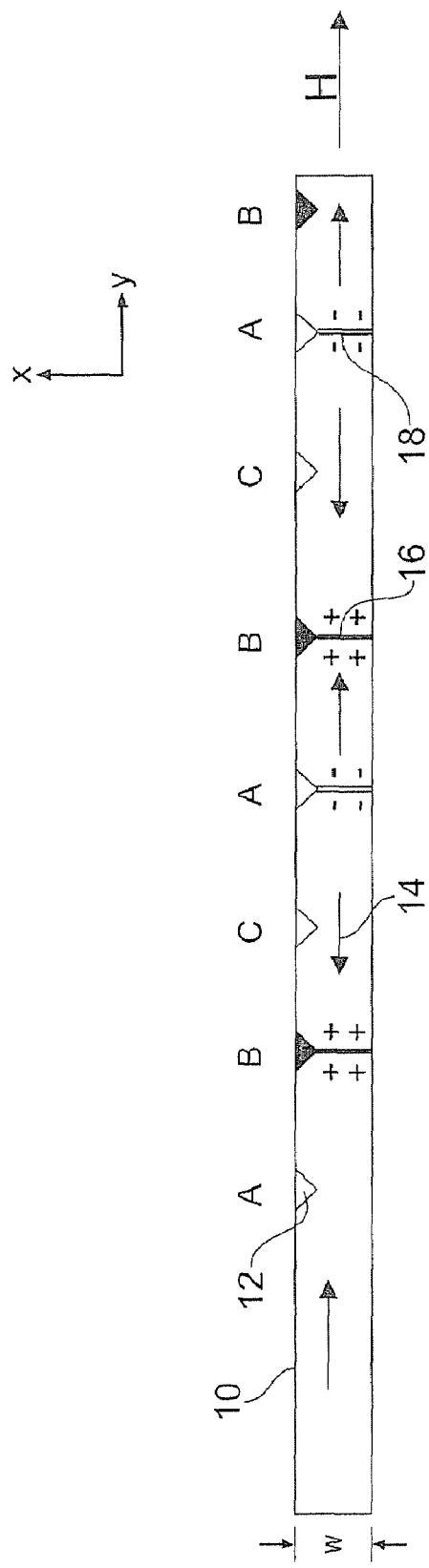
FIG. 1 is a schematic representation showing an example nanowire with inward notches.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

FIG. 1 is a schematic representation showing a portion of a nanowire 10 with a plurality of inward notches 12 along one side of the wire. The nanowire 10 is shown as being a relatively long, thin wire extending in a direction we define as the y-direction, not only in this figure but also in the following detailed description of an embodiment of the invention. The nanowire has a length 'l' (in the y-direction) longer than the illustrated portion and a width 'w' (in the x-direction). The nanowire width is typically in the submicron range, such as less than 0.2 μm (200 nm), more especially a width of the order of what is achievable with conventional lithography (currently 130 nm-65 nm but ever reducing). The nanowire will of course also have a depth 'd' in the z-direction defined by deposition of the nanowire. Typically, the nanowires will be fabricated by some form of deposition process, such as chemical vapour deposition (CVD), physical vapour deposition (PVD), thermal evaporation or sputtering and have a thickness typically in the range 1 nm to 100 nm. The nanowire is made of a soft magnetic material such as Permalloy ($Ni_xFe_y$, where x=80±2 and y=20±2). The magnetic material may be homogenous or inhomogeneous. Homogeneous magnetic materials include ferromagnetic materials and ferrimagnetic materials. Specific examples are Permalloy, other nickel-iron alloys, a cobalt-iron alloy, or nickel-cobalt-iron alloys. Further examples are alloys containing one or more of Ni, Co and Fe optionally including one or more of Si, B, Zr, Hf, Cr, Pd, and Pt.

The nanowires will be deposited on a suitable substrate material, typically a silicon (Si) or other semiconductor substrate for integration with integrated circuit elements.

In the figure, a number of inward notches 12 are shown schematically as having a triangular shape so as to locally reduce the nanowire width. Generally the shape of the notches is varied, and we characterise notches in terms of their area (in the xy plane), since energetic magnitude of the potential barrier (or well) can be expected to scale approximately with notch area. In the schematic, eight notches are shown and they are shown regularly spaced. Although all the notches are shown on one side of the nanowire, these could be on either side of the wire, for example they could alternate from being located on one side and the other along the wire. Moreover, the width modulation could take place on more than one side of the nanowire, for example on opposing side faces. Coincident constrictions or widenings could create an hour-glass or ribbed structure, for example. In a memory device, there will be a large number of notches along each wire, typically several hundred or thousand. As will be understood from the following, the maximum number of data bits that can be stored in a wire scales essentially linearly with the number of notches, so the number of notches will be chosen according to the memory specifications of the device. The distance between notches is essentially flexible. The device merely requires the inter-notch distance to be sufficiently short to ensure that only single magnetic domains are hosted. However, for practical purposes it will be convenient to have regular notch spacings along the nanowire as shown. Regular notch spacing will also ensure that the domain wall propagation time between notches at a given field strength will be well defined. Generally we envisage nanowires of length up to the chip size, which may be of the order of 1 mm to 1 cm or perhaps a few cm's, and notch spacing achievable with then-current state of the art lithography processing, e.g. 90 nm today, soon to be 65 nm, to provide nanowires with perhaps 1000-100,000 notches, most likely between a few thousand and tens of thousands of notches. It is also noted that the nanowires need not be straight. In this respect it is known that shallow bends of less than about 30 degrees in nanowires do not create significant domain wall pinning effects. Bends thus may be incorporated, for example when this is convenient for device integration.

The schematically illustrated domains hosted in the nanowire are now discussed. Each of the magnetic domains 14 is illustrated with a solid-headed arrow indicating the magnetic moment in the conventional way. Each domain is bounded by a domain wall 16, 18 extending in the xz plane and pinned to a notch or at the y-extremities of the nanowire at each end of the nanowire. As is understood in the art, the nanowire domain walls fall into two types, head-to-head domain walls 16 and tail-to-tail domain walls 18, the meaning of which will be self-explanatory. Head-to-head domain walls carry positive magnetostatic charge and tail-to-tail domain walls carry negative magnetostatic charge. The head-to-head domain walls are illustrated with a solid line and the tail-to-tail domain walls are illustrated with an open line. The positive and negative charges associated with the domain walls are also schematically illustrated.

It will thus be understood that the nanowire constitutes a domain wall conduit made of magnetic material having sufficient shape anisotropy that the magnetic moment of the domains aligns with the y-axis of the nanowire. It will be appreciated that the magnetic alignment in the region of the domain walls is more complex as will be understood from the prior art [13, 14].

Each of the notches is labelled either A, B or C in repeating sequence. This is an address labelling to indicate addressing with common heating electrodes. The "A" notches are commonly addressed with a first group of heating electrodes, the "B" notches are commonly addressed with a second group of heating electrodes, and the "C" notches are commonly addressed with a third group of heating electrodes. These electrodes are metal (e.g. aluminium, gold or copper) or metallic (e.g. silicide or degenerately doped semiconductor) that serve to locally heat the notches by resistive (Joule) heating when desired. Their purpose in the context of a memory device embodying the invention will be understood shortly.

Unidirectional domain propagation is only possible if the data coding scheme is chosen such that the device controller always knows which sign (head-to-head or tail-to-tail) domain wall is present at a given group of notches (A, B or C), although the controller does not have to know whether a domain wall is present or not. This requirement places a limitation on the maximum density of information that can be coded. Specifically, it means that 3 adjacent notches must be used for every single bit of information and that two domain walls must be used to code each bit. One possible scheme is thus that a 1 is coded by a head-to-head domain wall followed by a tail-to-tail domain wall spread across 3 notches, while a 0 is coded by the absence of any domain walls across the same length.

Once the physical coding has been chosen, the standard range of data coding algorithms currently used in the hard disk industry could be used to convert the file data to physical data, thus introducing error correction. In particular, in order to reduce magnetostatic interlayer coupling (which could reduce the thermal stability of data and hence increase the probability of data errors) it is desirable that long blocks of nanowires all with the same magnetisation direction should be avoided. Assuming the physical coding suggested in this paragraph, this means that large blocks of 0 should be avoided. Symbol conversion codes such as Gray codes should be applied to the data to be stored to resolve this. Similar requirements exist in conventional hard disk drives where the detection electronics loses phase lock if there are no data transitions for extended lengths of disk.

Figure 2A:
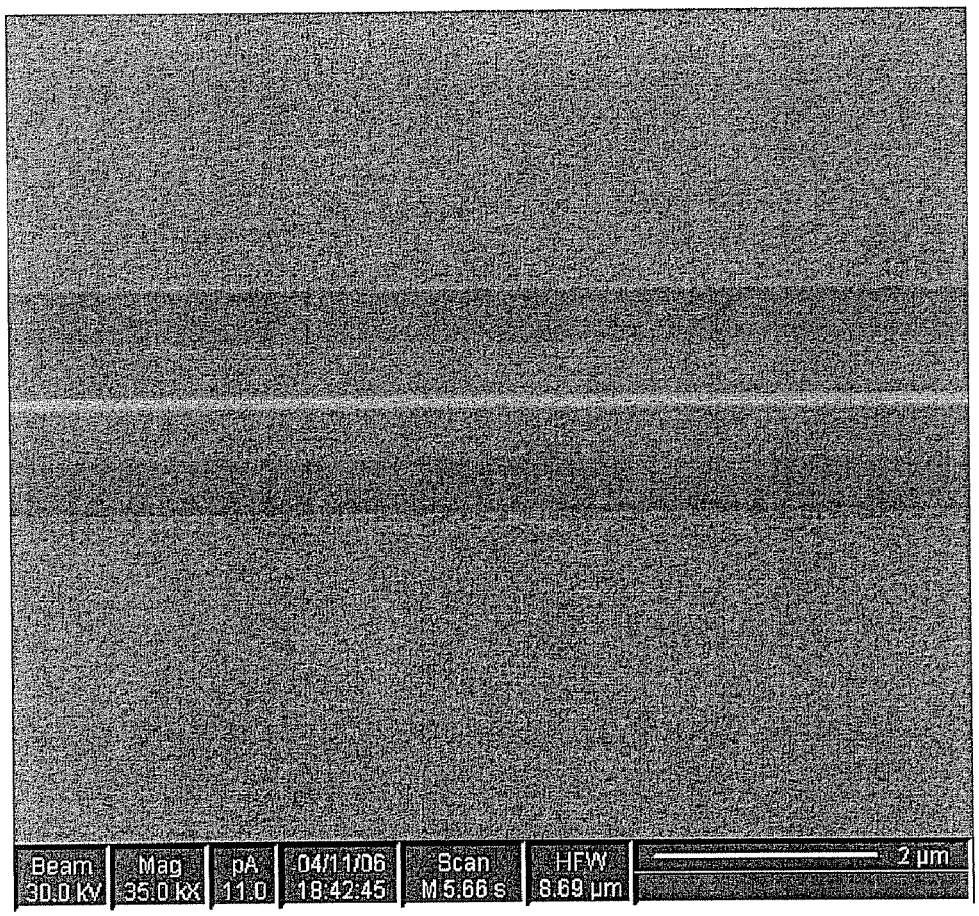
FIG. 2A is a scanning electron microscope (SEM) image showing a nanowire with an inward notch.

FIG. 2A is a scanning electron microscope (SEM) image showing a nanowire with a single inward notch.

Figure 2B:
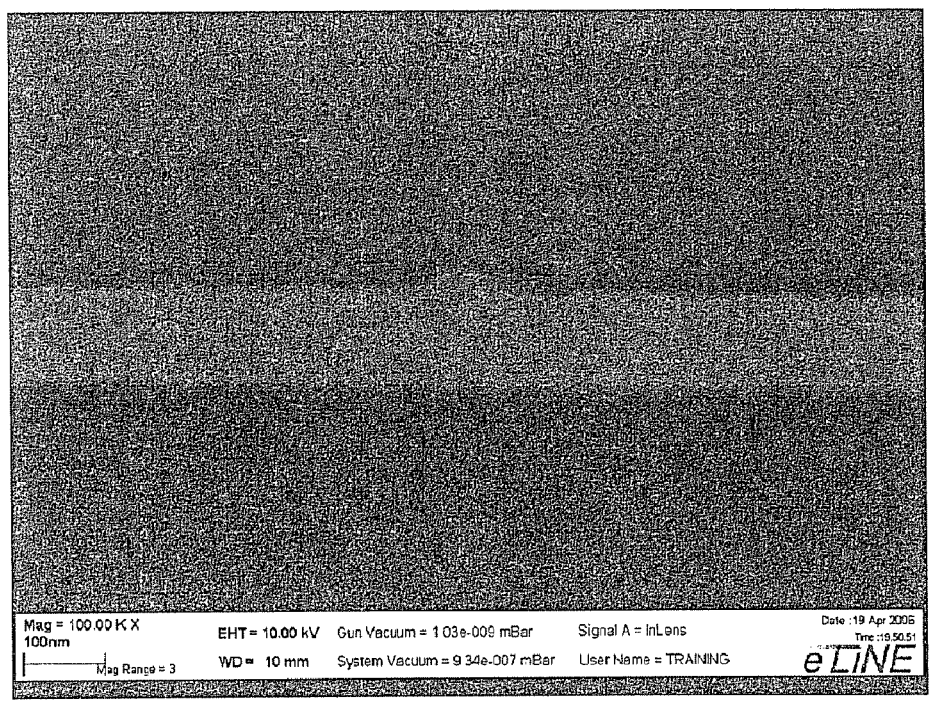
FIG. 2B is a scanning electron microscope (SEM) image showing a nanowire with an outward notch.

FIG. 2B is a scanning electron microscope (SEM) image showing a nanowire with an outward notch. In this respect it is noted that outward notches also result in an artificial domain wall pinning site. In the case of outward notches these are created by a local widening of a nanowire that in this example formed a potential well. The example nanowire has a width w=120 nm, d=8 nm with an outward notch of height 8 nm and width 120 nm.

More generally inward and outward notches are examples of a general class of artificial domain wall pinning sites. It is expected that pinning will be created by any sufficient modulation in the domain wall energy as a function of position along a wire, since a modulation forms either a potential well or barrier, both of which act to pin a domain wall.

There are two competing mechanisms which cause a structural variation such as a notch to cause an energy variation. The first is simply that the domain wall is shorter at the (inward) notch position. Domain wall energy is proportional to its length, and so this will tend to create an energy well. The competing tendency is that the local shape anisotropy is stronger in the vicinity of the inward notch, since the thickness-to-width ratio (z/x ratio) is larger in view of the fact that shape anisotropy is roughly proportional to the thickness-to-width ratio. The domain wall energy is proportional to the square root of the anisotropy, and so this creates a potential barrier. Experiments would indicate that the latter effect dominates the former for the notches fabricated to date, but for other notch shapes and other artificial pinning site types, it is possible that the former could dominate.

It has been established by the inventors that inward notches can form potential wells or barriers depending on the chirality of the domain wall. Similarly, it has been established by the inventors that outward notches can form potential wells or barriers depending on the chirality of the domain wall. Whether the notch is a barrier or a well is not determined by the notch structure alone, but is rather determined by a combination of the notch structure (e.g. whether it is an inward or outward notch) and the nature of the domain wall (i.e. head-to-head or tail-to-tail) and its chirality (i.e. whether the domain wall being considered is an upwardly or downwardly aligned transverse domain wall). It is noted that experiments on vortex domain walls have not been performed by the inventors at the present time, so the nature of the relationship between potential variation and chirality for vortex domain walls is not known. The determining factor that establishes whether the pinning sites are potential wells or barriers is whether the magnetization of the transverse domain wall is aligned (i.e. parallel) or anti-aligned (i.e. anti-parallel) with the magnetization in the vicinity of the notch, which is also dependent on the direction of propagation of the domain wall through the notch.

Apart from notches, local modulation in the domain wall energy could be created by any other suitable method, such as ion implantation or local alloying. Moreover, we have not modulated nanowire thickness to create the notches, and this is also possible.

The magnetic properties of the nanowire are now discussed with reference to the effect of a linear magnetic field $H_y$ applied to the nanowire along the y-direction.

Figure 3A:
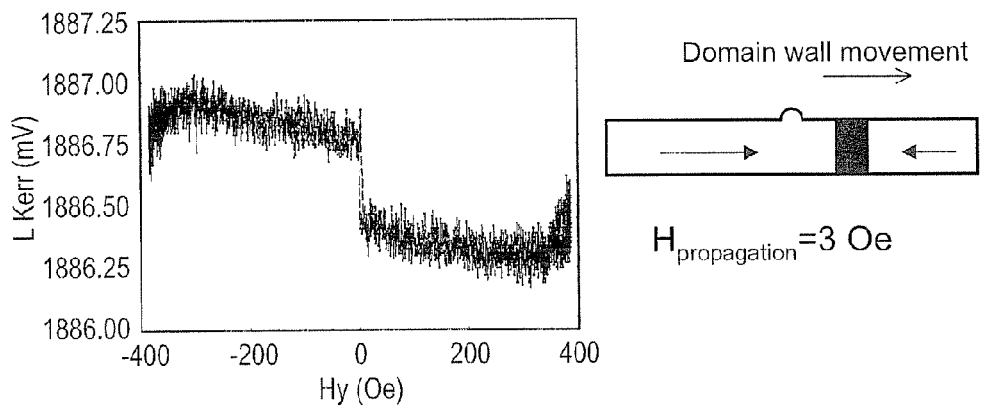
FIGS. 3A, 3B and 3C are similar graphs showing the hysteresis curve measured by a magneto-optic Kerr effect (MOKE) device of an example nanowire structure with an inward notch for domain wall propagation: in a straight section of the main body of the wire (FIG. 3A); through the notch (FIG. 3B); and for nucleation of a new domain wall at an end of the wire (FIG. 3C)
Figure 3B:
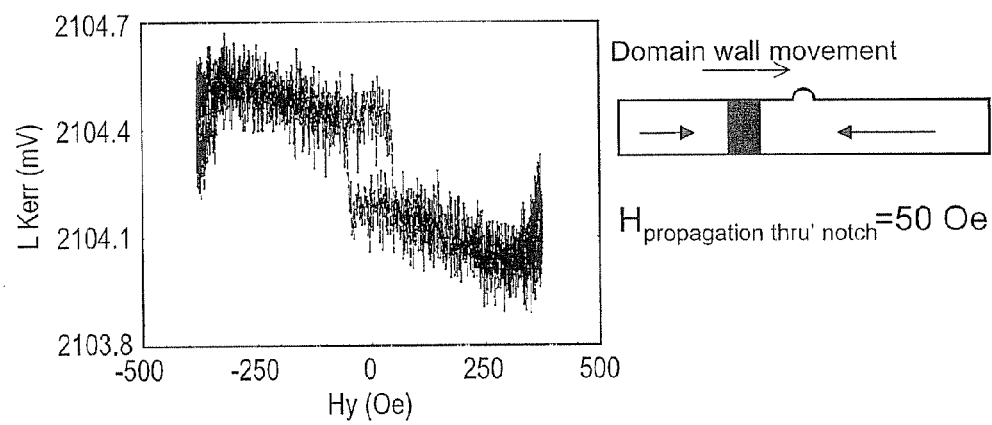
Figure 3C:
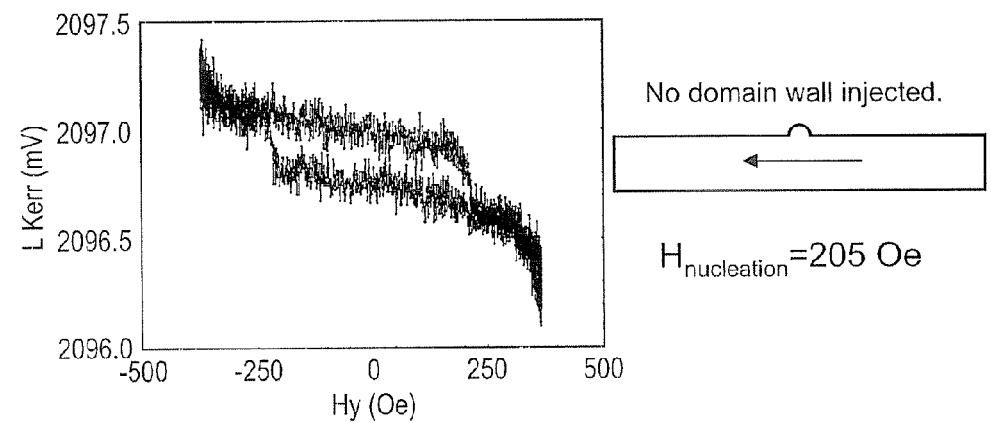

FIGS. 3A, 3B and 3C are graphs showing the hysteresis curve measured by a magneto-optic Kerr effect (MOKE) device of the example nanowire of FIG. 2B with an outward notch for domain wall propagation: in a straight section of the main body of the wire (FIG. 3A); through the notch (FIG. 3B); and for nucleation of a new domain wall at an end of the wire (FIG. 3C). Each graph plots the longitudinal (y-direction) Kerr signal against magnetic field strength $H_y$ in Oersted (Oe) units. To the right of each graph, a schematic of the nanowire property being measured is illustrated.

The MOKE device allows the magnetic properties to be measured locally at different regions along the nanowire. In the straight section of the wire away from any notch (FIG. 3B), it is seen that the domain walls are mobile with a field of around 20 Oe, whereas in the notch region (FIG. 3A) a larger field of around 40 Oe is required to make a domain wall move through the notch. Finally, FIG. 3C shows that a still larger field of around 70 Oe is need to create a new magnetic domain (and associated domain wall) at the end of the nanowire.

For an example nanowire, these results thus show clear separation between: the domain nucleation field (FIG. 3C), which is the field that must be applied to reverse magnetisation in a nanowire if no reverse domain already exists in the wire; the domain propagation field (FIG. 3B), which is the field that must be applied to move a domain wall along a nanowire; and the locally enhanced domain propagation field needed to render domain walls mobile across (and out of) a notch or other pinning site (FIG. 3A), which we refer to as the depinning field elsewhere in this document.

Similar results have been accumulated for a number of example nanowires with inward and outward notches.

Figure 4A:
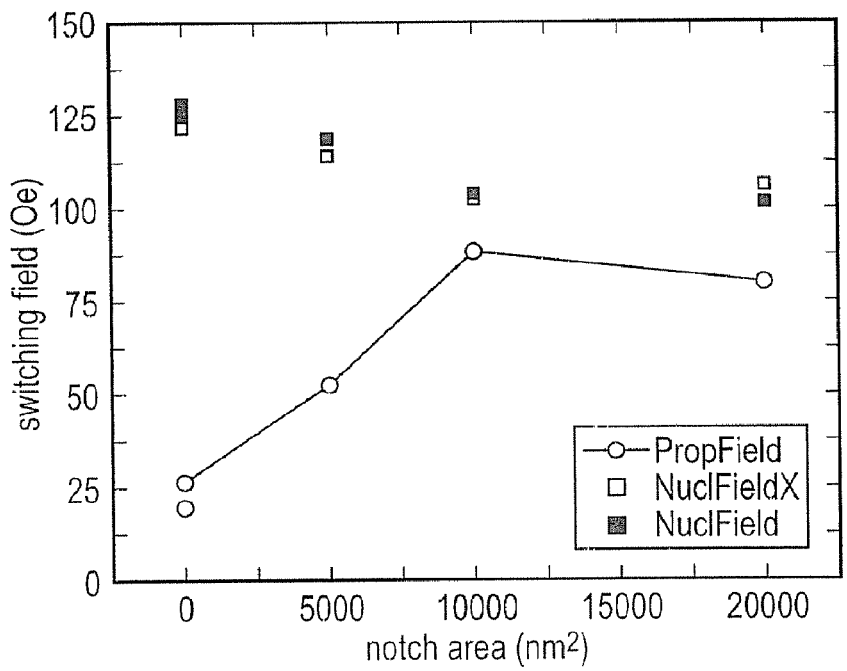
FIG. 4A is a graph showing the switching field against notch size for a number of example structures with inward notches for each of the propagation field (open circle), nucleation field X (open square) and nucleation field (filled square)

FIG. 4A is a graph showing the switching field against notch size for a number of example structures with inward notches for each of the propagation field (open circle), and two measurements of nucleation field (squares) where the open squares are measurements of the nucleation field with a field applied directly along the nanowire, i.e. precisely aligned with the y-direction, and the filled squares are measurements of the nucleation field with a field applied at an angle of a few degrees to the y-direction. The notches are classified according to their area in the xy plane.

Figure 4B:
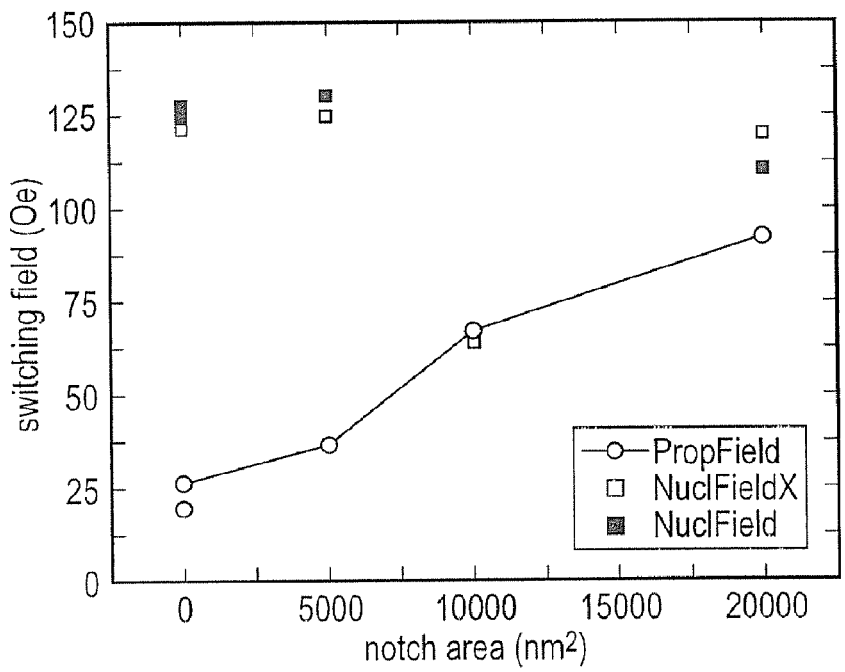
FIG. 4B is a graph showing the switching field against notch size for a number of example structures with outward notches for each of the propagation field (open circle), nucleation field X (open square) and nucleation field (filled square)

FIG. 4B is a graph showing the switching field against notch size for a number of example structures with outward notches for each of the propagation field (open circle), nucleation field X (open square) and nucleation field (filled square).

From these results it can be seen that there is a range of notch areas where there is a significant difference between the nucleation and propagation fields. This is significant in the context of a device embodying the invention, since it shows that domain walls can be propagated along a nanowire without creating new domains by applying a field of appropriate strength of above the propagation field, but below the nucleation field.

Having now described the basic elements of a nanowire which forms an element of a memory device embodying the invention, the operating principle of a nanowire memory element is now described.

Figure 5:
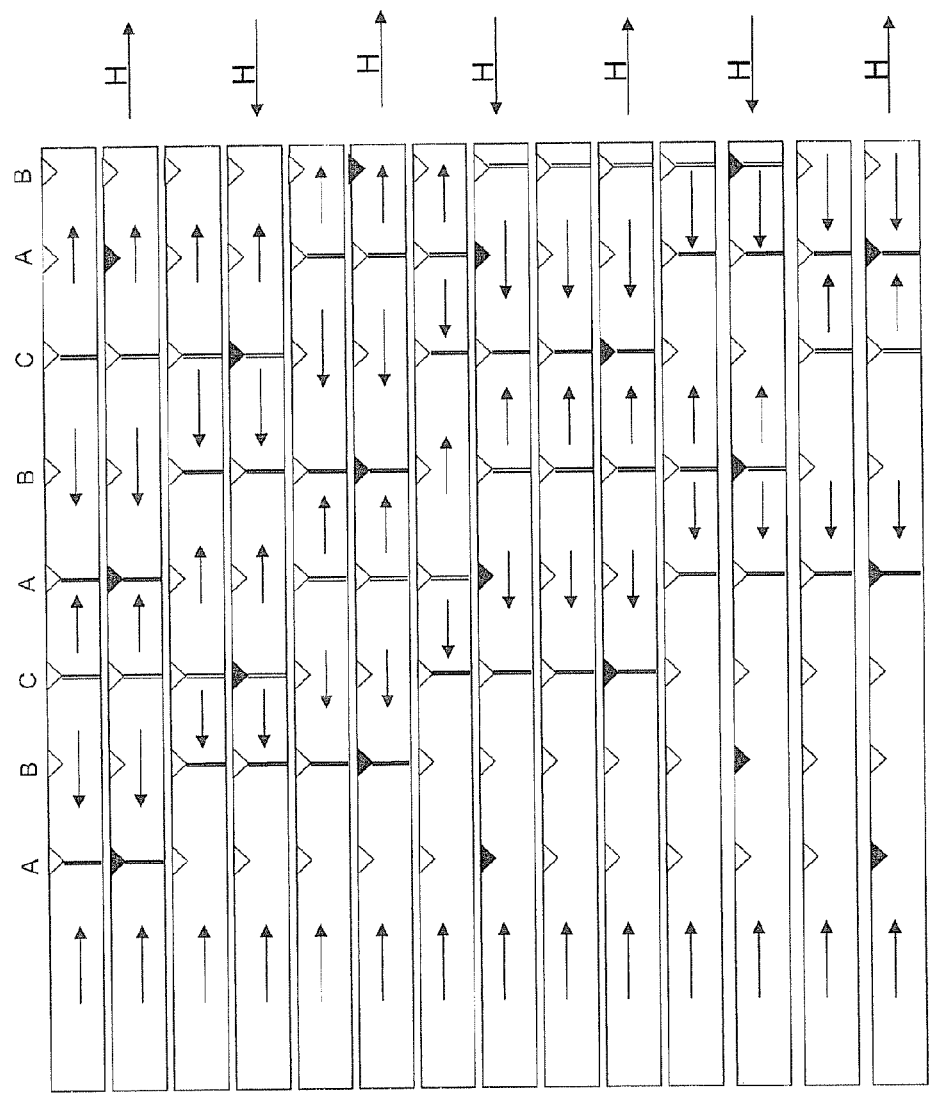
FIG. 5 is a schematic representation showing from top to bottom the same nanowire at a succession of time increments in which the motion of magnetic domains is evident.

FIG. 5 is a schematic representation showing from top to bottom of the nanowire of FIG. 1 at a succession of 14 time increments.

The nanowire is acted on by an alternating linear magnetic field, where the time increment is arbitrary, but assuming that the magnetic field alternates periodically, is a quarter period. The field direction, +y or −y is shown down the right hand side of the figure. The device operation is essentially asynchronous so any periodicity with reference to real time is not needed. All that is needed is for appropriate alternating fields to be applied in the illustrated time sequence, which may be periodic or aperiodic. Long periods may elapse between applications of the field since the domains are stable, i.e. the memory device is non-volatile, which is a feature used in the device.

It is further noted that a rotating magnetic field can produce the required alternating magnetic field in that the field directions will be opposed each half period. However, an alternating linear magnetic field may be more convenient to generate than a rotating field and also more compatible with an asynchronous device.

At different time increments different ones of the heating electrode groups A, B, C are selectively actuated with a current to cause local heating of the notches, this being depicted by filling of the heated notches. The actuation is in repeats of A, C, B with one non-actuated time increment in between.

The role of the local heating is now described. It has been established that the locally enhanced propagation field at a notch can be lowered by local heating of the notch. Thermal energy applied to the notch through applying a temporary current pulse to the associated heating electrode will therefore temporarily lower the locally enhanced propagation field for that notch.

Now, if a magnetic field is applied having a strength below the locally enhanced propagation field of the notches in the absence of heating, but above that field when the notches are heated, then the heating has the effect of depinning domain walls that are located at the notches. This field will also be lower than the depinning field, i.e. the field at which domain walls become mobile across the notches in the absence of heating. This field is referred to as the operating field in this document, and the depinning energy is used to refer to the energy that needs to be applied to a pinning site to temporarily lower the locally enhanced propagation field to below the operating field. This energy will be thermal energy in the case of heating electrodes, but in principle other forms of energy injection could be contemplated, such as optical. Current-induced magnetic fields could also be used to increase the magnetic field at the pinning sites to above the locally enhanced propagation field. This option is described in detail further below.

Further it is noted that under the influence of a given field, head-to-head domain walls and tail-to-tail domain walls will tend to move in opposite directions, with the positively charged head-to-head domain walls moving in the field direction, and the negatively charged tail-to-tail domain walls moving opposite to the field direction. Indeed, this feature of domain walls is a known feature for magnetic field induced domain wall manipulation, since an applied field will tend to make head-to-head and tail-to-tail domain walls move towards each other and annihilate so that domains coalesce. This is sometimes useful, for example for resetting a nanostructure by destroying multiple domains, but is also sometimes a problem when it is desired to preserve domains in a nanostructure while moving them.

The operation of the nanowire device element is now described with reference to each of the 14 time increments in turn.

1. The nanowire portion illustrated hosts 5 domains, 3 of which extend between illustrated notches, namely notches 1-3, 3-4 and 4-6, and 2 at either end of the illustrated wire portion which extend beyond the ends of the illustrated wire portion. The domains are adjacent to each other. It is noted that all head-to-head domain walls are located at A notches, i.e. notches addressed by electrode group A, and that all tail-to-tail domain walls are located at C notches, i.e. notches addressed by electrode group C. Moreover, it is noted that no domain walls are hosted by the B notches. Further, it is noted that the +y aligned domain in the middle of the illustrated wire portion is only one notch long and the two adjacent −y aligned domains are two notches long. The two end domains that extend beyond the ends of the illustrated wire section are longer. (A long domain of say 12 notch lengths might encode a succession of zeroes for example.)

2. Electrodes A are actuated while applying a +y operating field.

3. Under simultaneous action of the +y operating field and the local heating of the A notches, the head-to-head domain walls propagate in the +y-direction, which is the general data flow direction of the serial memory element that the nanowire constitutes, before being pinned at the next adjacent notches in the +y-direction, i.e. the B notches. The +y aligned domain in the middle has thus been extended from one to two notches long and the adjacent −y aligned domains have been contracted from two to one notch long.

4. Electrodes C (hosting tail-to-tail domain walls) are actuated while applying a −y operating field.

5. Under simultaneous action of the −y operating field and the local heating of the C notches, the tail-to-tail domain walls propagate in the +y-direction, i.e. to the A notches. The +y aligned middle domain has thus been contracted from two to one notch long and the adjacent −y aligned domains have been extended from one to two notches long. Comparing with time increment 1, it can be seen that the domains have now been moved along one notch in the +y-direction.

6. Electrodes B (hosting head-to-head domain walls) are actuated while applying a +y operating field.

7. Under simultaneous action of the +y operating field and the local heating of the B notches, the head-to-head domain walls propagate in the +y-direction, i.e. to the C notches.

8. Electrodes C (not hosting any domain walls) are actuated while applying a −y operating field.

9. This is a dead time increment since the actuated notches C are not hosting any domain walls.

10. Electrodes C (hosting head-to-head domain walls) are actuated while applying a +y operating field.

11. Under simultaneous action of the +y operating field and the local heating of the C notches, the head-to-head domain walls propagate in the +y-direction, i.e. to the A notches.

12. Electrodes B (hosting tail-to-tail domain walls) are actuated while applying a −y operating field.

13. Under simultaneous action of the −y operating field and the local heating of the B notches, the tail-to-tail domain walls propagate in the +y-direction, i.e. to the C notches.

14. Electrodes A are actuated while applying a +y operating field.

This operation can be continued in the same way to move domains along the nanowire in the data flow direction. At each increment all the head-to-head domain walls are hosted at one set of commonly addressed notches, and all tail-to-tail domain walls are hosted at a different set of commonly addressed notches, with a third set of commonly addressed notches not hosting any domain walls. This segregation allows the positive and negative domain walls to be independently moved from one notch to the next in the data flow direction under action of oppositely aligned operating fields. Each domain is thus moved in a stepwise manner in the data flow direction with the domain length being incrementally varied between 2 and 1 notches. More generally, larger domain lengths can be used, although the number of domains per inter-notch distance is reduced, thereby reducing the data density.

It will thus be understood that the relationship between the heating pulses and the operating field sequence is as follows:

| Fraction through full cycle | Applied field | 'A' notches | 'B' notches | 'C' notches |
| --- | --- | --- | --- | --- |
| 1/6 | positive | Heated | Not heated | Not heated |
| 2/6 | negative | Not heated | Not heated | Heated |
| 3/6 | positive | Not heated | Heated | Not heated |
| 4/6 | negative | Heated | Not heated | Not heated |
| 5/6 | positive | Not heated | Not heated | Heated |
| 6/6 | negative | Not heated | Heated | Not heated |

The controlled movement of a stream of magnetic domains along a nanowire memory element will now be understood, namely by applying a depinning heat energy alternately to notches hosting head-to-head and tail-to-tail domain walls in synchrony with alignment and anti-alignment of the operating field with the data flow direction. This moves the magnetic domains along the nanowire in the data flow direction and thereby moves data serially along the nanowire in the data flow direction. It will be understood that this is a shift register function. The way in which domains are read into and out of the nanowires has not yet been described, but will now be described with reference to the following figures.

Figure 6:
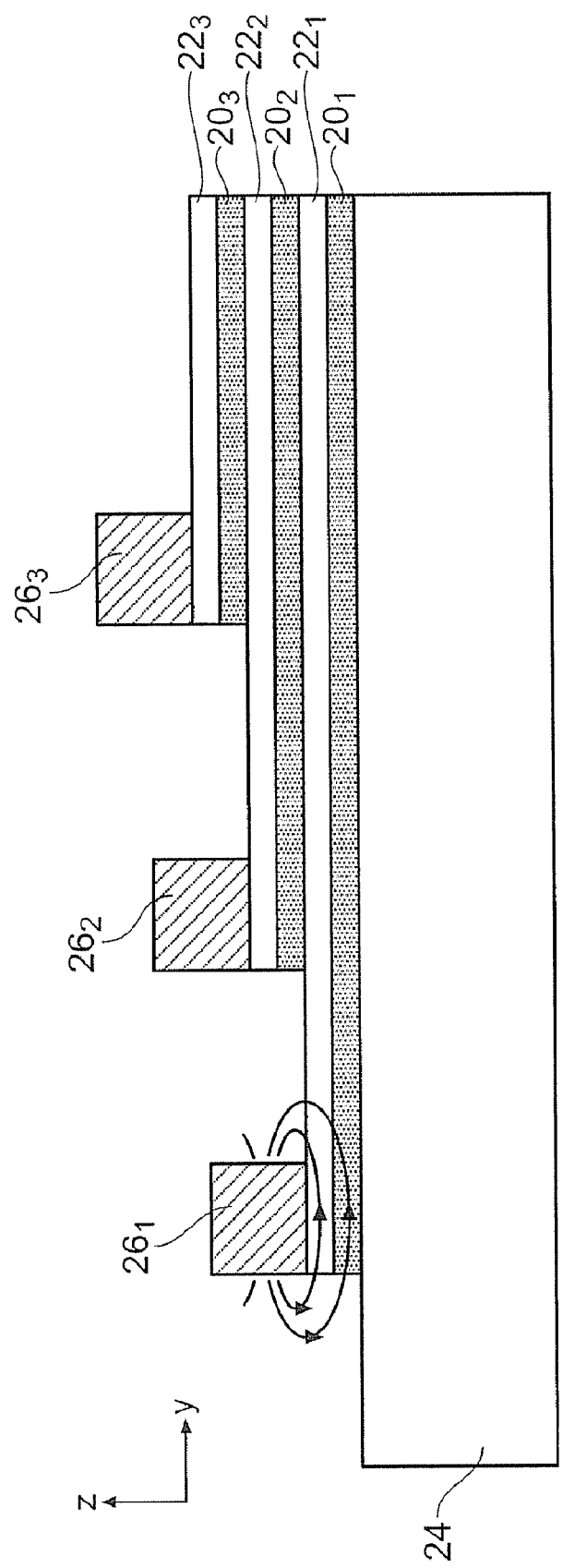
FIG. 6 is schematic side section view of an input side of a memory device embodying the invention in the yz plane.

FIG. 6 is schematic side section view of an input side of a memory device embodying the invention in the yz plane. The figure shows a stack of nanowires, formed by magnetic layers 20, separated in the z-direction by non-magnetic material, formed by non-magnetic layers 22, arranged on a substrate 24. Three pairs of magnetic and non-magnetic layers are shown by way of example. As previously mentioned, the nanowires may be made of Permalloy or other magnetic material. The non-magnetic layers may be made of any conveniently fabricated material with suitable electrical and thermal insulating properties that are compatible with the magnetic material and the various addressing and heating electrodes. For example, the non-magnetic material may be silicon dioxide ($SiO_2$) or silicon nitride ($Si_3N_4$), aluminium oxide ($Al_2O_3$), aluminium nitride (AlN) or some other material generally compatible with the device integration.

The thickness of the non-magnetic spacer layer between the nanowires should be large enough to minimise magnetostatic interlayer coupling between domains in neighbouring layers. However, it should not be thicker than necessary, since it will merely increase the total thickness of the nanowire stack without benefit, thus making it more difficult to fabricate. A non-magnetic layer thickness of around 50 nm, e.g. 30-70 nm or 20-80 nm is probably close to the optimum.

In a real device there may be any desired number of nanowire layers 20. The device structure is inherently scalable in the z-direction, which is one of its key advantages, so a large number of nanowire layers may be provided. In particular, it is envisaged that 10-1000 or 100-1000 or more nanowire layers may be provided in a device. The memory storage capacity will scale essentially linearly with the number of layers so will influence the choice of the number of layers in any given device.

Although not visible from this particular figure, it will also be appreciated that each nanowire layer comprises a plurality of nanowires, each extending in the y-direction and being spaced apart in the x-direction, with adjacent nanowires being separated by non-magnetic material, which may be the same non-magnetic material as used for the non-magnetic layers 22, or a material dictated by the lithography, such as the substrate material, typically Si, or an air gap.

Returning to the figure, it is evident that each nanowire layer (and its accompanying overlying non-magnetic layer) terminates in the −y-direction before the end of the nanowire layer below it, so the nanowire layers are staggered in the y-direction to form a terracing or stepped structure through successive termination of the uppermost pair of layers. On each step there is shown a single metal or metallic electrode 26 that extends in the x-direction (out of the plane of the figure). One such electrode is provided for each nanowire, so there are as many electrodes 26 on each step as there are nanowires per layer. Each electrode will have a relatively short portion extending in the x-direction over the end of the associated nanowire (the illustrated portion) and two relatively long portions leading to the interconnects that extend generally in the y-direction. The illustrated short portion of each electrode 26 is thus arranged on the non-magnetic layer and above an end portion of an associated nanowire.

The electrodes 26 are examples of nucleation field generators and are variously referred to as domain wall injection electrodes, data input electrodes or read-in electrodes to indicate their function in the device.

The data input function is now described. The nucleation field of a nanowire reduces towards its end. Consequently, if a magnetic field is applied along the length of a nanowire which is above the locally reduced nucleation field at the nanowire end portion, but below the nucleation field in the main body of the nanowire, then a domain wall (or domain) can be created at the end portion of the nanowire.

Now consider a current applied to the central electrode $26_2$ of the figure. This will tend to create an annular magnetic field with a significant component in the y-direction in the nanowire $20_2$ lying below it, and also the bottom nanowire $20_3$ further below it. The current can be selected so that the magnetic field it generates in the nanowire $20_2$ is above the locally reduced nucleation field at the nanowire end portion, but below the nucleation field in the main body of the nanowire. Moreover, the peak magnetic field generated by the current flowing in the electrode $26_2$ is incapable of creating a domain wall in the bottom nanowire $20_3$, since to do so it would need to exceed the nucleation field for the main body of the nanowire in view of the fact that the end of the bottom nanowire $20_3$ is well separated from the electrode $26_2$.

It will thus be appreciated that the stepped structure means that each electrode $26_n$ creates a field that is local to the end region of its associated nanowire layer $20_n$ and so can selectively create domain walls only in that nanowire layer by exploiting the locally reduced nucleation field caused by end effects. Moreover, it will be appreciated that this is achieved without having to resort to 3D contacting or addressing scheme. The whole contacting and addressing scheme is kept planar, i.e. 2D, even though the memory structure, i.e. the nanowires, are arranged in 3D. The benefits of a 3D memory are thus achieved, i.e. increased memory capacity per unit chip area, without additional complexity associated with having to use a 3D contacting and addressing scheme.

The requirement to individually address each nanowire on the input side with its own electrode 26 may be the limiting factor in the packing density of the nanowires in the x-direction. For example, the nanowires may need to be separated by 1-10 μm or more at least at the external contacting location for the lead frame to provide room for the input addressing. Splaying of the wires may be used so the separation is sufficiently large at the lead frame, but reduces to a nanoscale separation where the electrodes 26 cross the nanowire end portions.

Having now described the data input side of the memory device, the data output side is now described.

Figure 7:
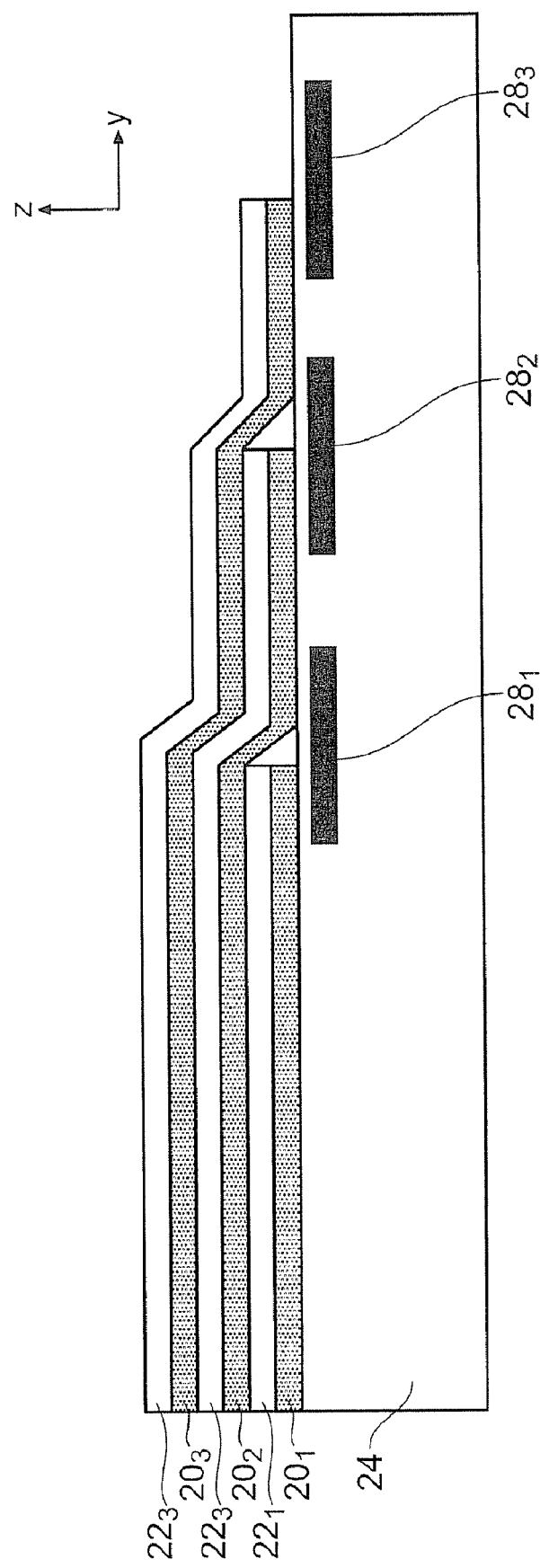
FIG. 7 is schematic side section view of an output side of a memory device embodying the invention in the yz plane.

FIG. 7 is schematic side section view of an output side of a memory device embodying the invention in the yz plane. The same nanowire layers 20 and non-magnetic layers 22 as shown in FIG. 6 are evident. As illustrated, the nanowire layers 20 and their associated non-magnetic layers 22 terminate in a staggered manner, whereby the lowest layers $20_1$ and $22_1$ terminate first, as viewed in the +y-direction. This termination causes each of the overlying pairs of layers 20 and 22 to lower or step down by the combined thickness of the terminated bottom layer. This is schematically illustrated as stepping down over a relatively limited extent in the y-direction in the form of a ramp. The layers n=2 and n=3 then extend for a further distance in the y-direction before the layers n=2 are terminated, causing the layers n=3 to step down across a further ramp. Finally the top layer (n=3 in this figure) is terminated. A terracing is thus obtained through successive termination of the lowermost pair of layers.

Underneath each end portion of the nanowire layers $20_n$, i.e. in the termination region, a magnetic detector $28_n$ is shown embedded in the substrate 24. This is to indicate that the magnetic detectors are integrated in the silicon (or other semiconductor). Here it will be understood that term substrate is used loosely as an umbrella term for the underlying semiconductor structure including conventional epitaxial layers, doping regions and so forth, rather than in a strict sense to refer to a bare unprocessed wafer portion.

The magnetic detectors $28_n$ serve to detect the presence either of a magnetic domain, or a domain wall by detecting stray field from the end portion of their associated nanowire layer $20_n$. The magnetic detectors may be based on magnetic tunnel junctions, spin valves or the Hall effect (e.g. Bismuth or InSb) for example as is known in the art. Another alternative would be to have a magnetic detector in direct electrical contact with the nanowires, such that the nanowires form the so-called free layer of a magnetic tunnel junction or spintronic device. Electrical contacts could also be placed on either side of the notches to measure the AMR to detect the presence or absence of a domain wall at that notch [12].

Similar to the read in side of the device, it will be appreciated that this read out scheme for the stacked 3D memory elements constituted by the nanowire layers is implemented purely using planar, i.e. 2D, semiconductor integration methods in that the magnetic field detectors for the different nanowire layers in z are spaced apart in y. No additional structuring in the z-direction is required in the fabrication other than the fabrication of the nanowire layers themselves.

The requirement to measure the field of each nanowire on the output side with its own detector may be the limiting factor in the packing density of the nanowires in the x-direction.

Figure 8:
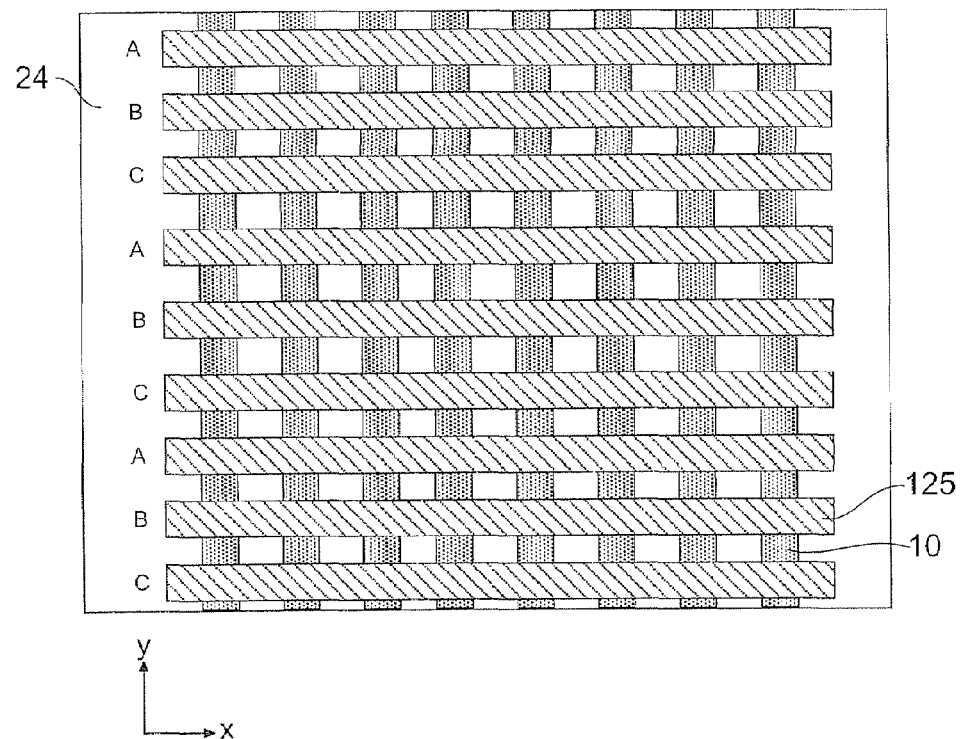
FIG. 8 is a schematic plan view of a central part of a memory device embodying the invention in the xy plane.

FIG. 8 is a schematic plan view of a central part of a memory device embodying the invention in the xy plane. The illustrated central part may be thought of as the part between (in the y-direction) what is shown in FIGS. 6 and 7, i.e. the part between the read in and read out ends of the device. In the schematic plan view illustration, a device with eight nanowires 10 per layer are shown on the substrate 24, although it will be appreciated that in general a much larger number of nanowires will be provided in each nanowire layer. For example, using a 90 nm lithography, then, if the active device portion of the die is 1 cm square, there will be space for 55,000 nanowires per layer. The non-magnetic material between the nanowires in the x-direction (and also the z-direction) is not explicitly drawn, but is inferred from its omission.

Also evident in the figure are the heating electrodes 25 which are labelled A, B and C according to their previously described common addressing. In all, nine lines of electrodes are illustrated, although it will be appreciated that in a real device there will be a large number of these, typically hundreds or thousands, according to the number of notches provided, as has already been discussed.

Figure 9A:
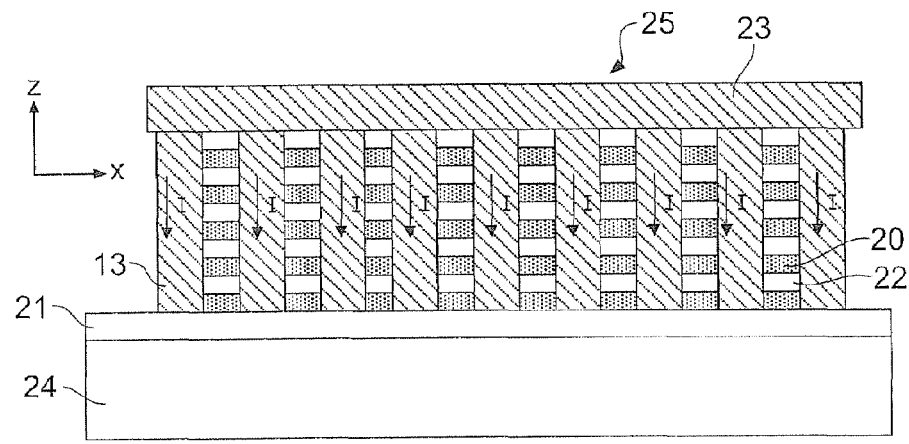
FIG. 9A is a schematic side view of a central part of a memory device embodying the invention in the xz plane.

FIG. 9A is a schematic side view of the same central part of a memory device as shown in the previous figure, but in the xz plane, i.e. side elevation. In combination with FIG. 8, it will be appreciated that the heating electrodes 25 are in "comb"-like sets with each of the electrode bars 23 being the spine of a comb of the kind visible in FIG. 9A, where the "tines" 13 of the comb are vertically extending electrode parts passing vertically through the nanowire layers. A conducting layer 21 is also shown on the substrate 24 which is a current return plane that serves to close the current loop needed by the heating electrodes, as illustrated schematically by the arrows labelled I. The conducting layer 13 may be a suitably degenerately doped semiconductor layer, a silicide layer, or a metal layer deposited on the substrate.

Although we describe the electrode structures as combs, it will be appreciated that in FIG. 9A and also the other figures that show the z-direction the z scaling is grossly exaggerated for the purposes of explanation. Typical devices will extend in millimetres or centimetres in the xy plane, whereas the nanowire layers will typically only be of the order of 1-100 nm thick, so the total thickness of the magnetic structure will only be perhaps 1-100 μm in a typical device.

In order to keep the same current running down all heating pillars, it may be beneficial to insert a thin layer of a higher resistivity material such as carbon either between the bottom of the pillars and the return current path (i.e. between 13 and 21) or between the top of the pillars 13 and the bar 23 that goes across the top connecting the pillars 13. These can be deposited at the same time by temporarily switching off the metal deposition and switching on carbon deposition to insert this layer.

Figure 9B:
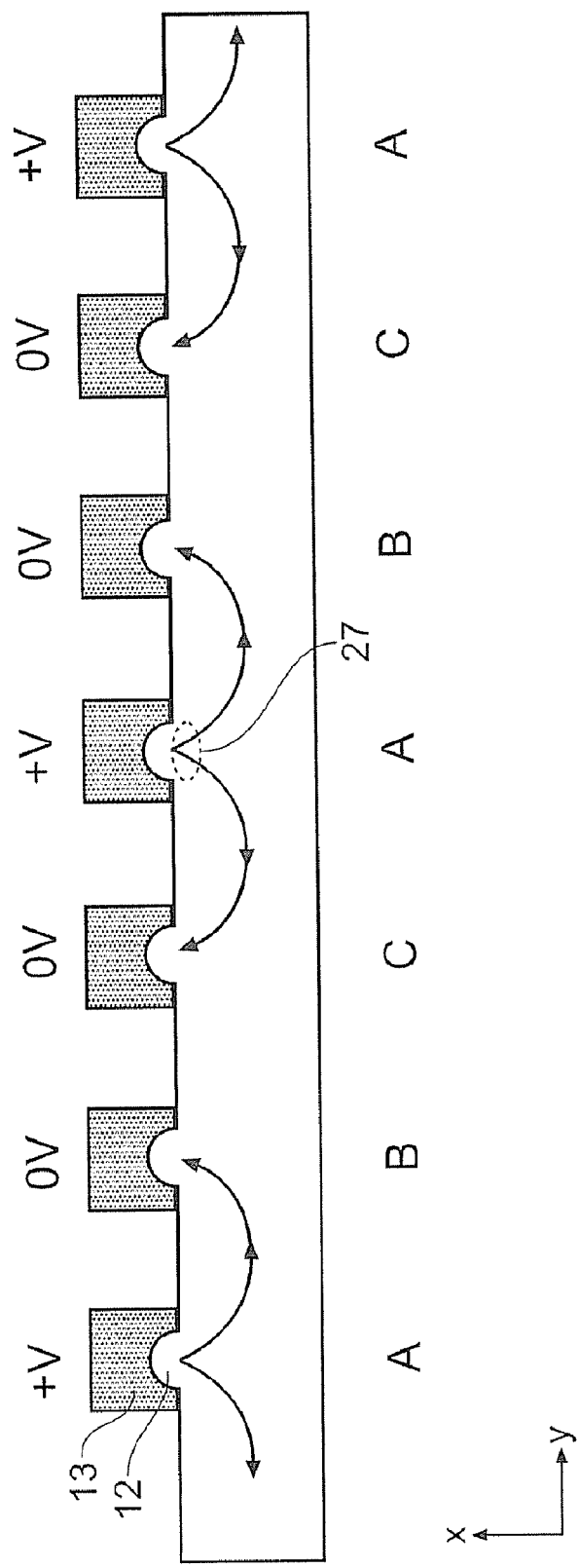
FIG. 9B is a schematic plan view in the xy plane of a single nanowire and associated heating electrode pillars provided to illustrate an alternative notch heating scheme to that of FIG. 9A.

FIG. 9B is a schematic plan view in the xy plane of a single nanowire and associated heating electrode pillars provided to illustrate an alternative notch heating scheme to that of FIG. 9A. Like the current scheme of FIG. 9A, the scheme of FIG. 9B heats selected pillars 13 and then allows thermal contact to transfer that heat to the associated notch area. The heating contacts in FIG. 9B are arranged in exactly the same way as for FIG. 9A, except that the current return plane 21 (FIG. 9) is dispensed with, the pillars 13 terminating instead at an insulating base. The heating pillars 13 are centred on the notches as before as is evident from FIG. 9B. To heat a given set of notches (A, B or C), a voltage is applied to the pillars in contact with that set of notches, and a different voltage is applied to the other sets of pillars. For example, in the figure we show a voltage +V, e.g. +1V, being applied to the pillars in contact with 'A' notches and 0V being applied to the pillars in contact with the 'B' and 'C' notches. This causes a current to flow in the centre of the A notches, half of which flows in the −y-direction to exit the nanowire 10 through C notches, the other half of which flows in the +y-direction to exit the nanowire 10 through the B notches, as indicated in the figure by the arrows. By Kirchoff's 1$^{st}$ law, the current through notch A must be twice the magnitude of the current through each of notches B and C. These currents will heat the nanowire directly. Since Joule heating is proportional to the square of the current, the immediate vicinity of notch A will be heated 4 times as strongly as all other parts of the nanowire, creating regions of most intense heating 27 in the immediate vicinity of the A notches, allowing selective depinning of the domain wall from only the A notches. The precise magnitude of current injected through a notch must be carefully tuned such that the heating effect is strong enough to release domain walls from the desired notch and not strong enough to depin elsewhere. The same order of heating is followed as described above (see e.g. the above table). Moreover, the electrically insulating spacer layers 22 situated between the magnetic layers localises the heating current to the magnetic nanowire layers 20 and no wasted heat is generated in the (thicker) spacer layers.

Typical current densities to achieve sufficient heating are $10^7$ A cm$^{-2}$. Since the sign of the current is not relevant, it might be desirable to alternate the sign of the voltage on subsequent heating pulses to reduce electromigration. The electrical pulse duration to induce heating should be of the same of magnitude as the thermal time constant of the integrated nanowire. If it is much shorter than this, then the nanowire will not heat fully. If it is longer than this, the temperature will not continue to rise much further (and hence there will be no further depinning), but the total power dissipation from the device will continue to rise. Typical thermal time constants are 1-10 ns.

Figure 9C:
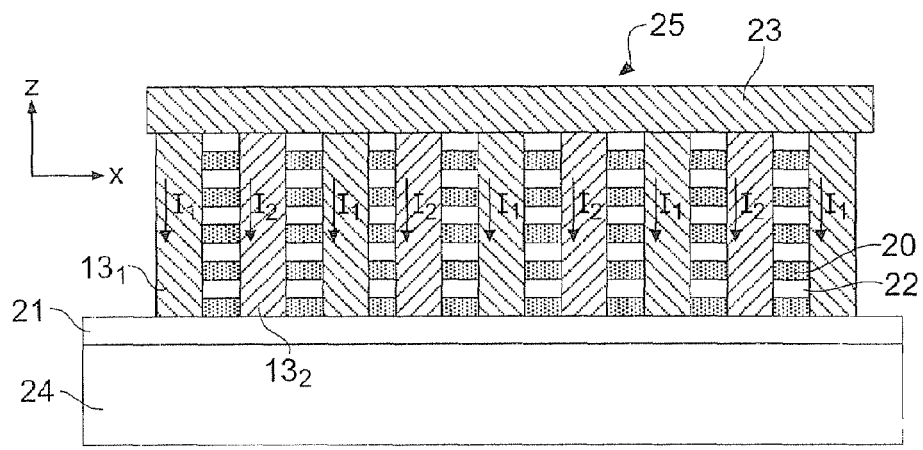
FIG. 9C is a schematic side view of a central part of a memory device according to an alternative embodiment in the xz plane.
Figure 9D:
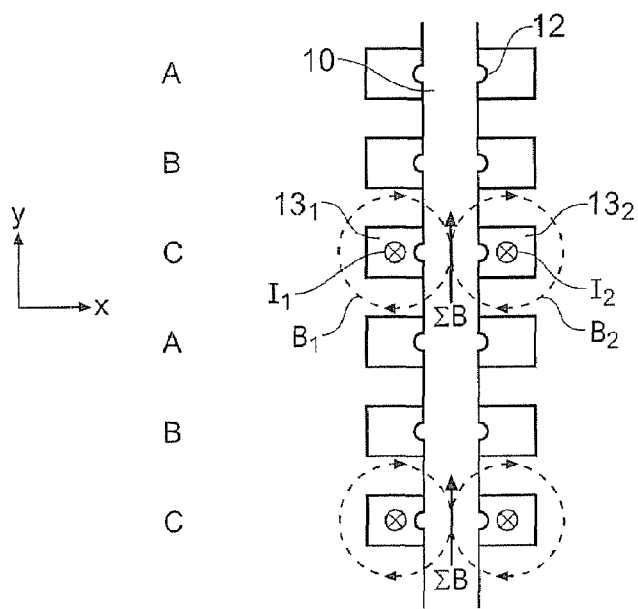
FIG. 9D is a schematic plan view in the xy plane of a single nanowire and associated electrode pillars of the embodiment of FIG. 9C.

FIGS. 9C and 9D illustrate a further option for moving the domain walls between notches. In this implementation, current-induced magnetic fields are used to increase the magnetic field at the pinning sites to above the locally enhanced propagation field.

The features of FIG. 9C will be understood from FIG. 9A which it largely replicates. The structure of FIG. 9C differs from that of FIG. 9A only in the electrode structure. The pillars 13 that form the "tines" of the comb electrodes, each comb forming one of either the "A", "B" or "C" electrode groups, alternate in the x-direction between pillars 13$_1$ of a first conductive material, such as gold, and pillars 13$_2$ of a second conductive material, such as copper, wherein the first and second materials have different electrical conductivities.

As is well known from the Biot-Savart law, a current travelling down a straight wire induces a magnetic field with cylindrical symmetry field lines, wherein the field at any point away from the wire has a magnitude proportional to the current and inversely proportional to the distance from the wire. Consequently, for two parallel wires with different currents flowing through them, there is a net magnetic field parallel to the wires mid-way between them.

Referring to FIG. 9C, when a common drive signal is applied to cause current to flow between the bar 23 and conducting layer 25, the pillars 13$_1$ and 13$_2$ effectively form a parallel resistor network in which the current I$_1$ flowing down a pillar 13$_1$ will be $R_2/(R_1+R_2)$, where $R_1$ and $R_2$ are the resistances of pillars 13$_1$ and 13$_2$ respectively. Similarly, current I$_2$ flowing down a pillar 13$_2$ will be $R_1/(R_1+R_2)$. For example if the pillars are made from gold and copper, then more current will flow down the copper pillars than the gold pillars by virtue of the lower resistivity of copper.

More generally it will be understood that the above implicitly assumes that the pillars have the same dimensions. The relevant parameter is of course that the pillars of the two types have different electrical resistivities, and this is also affected by the dimensions of the pillars. For example, the pillars could all be made of the same material, but have different resistivities by virtue of having different cross-sectional area, i.e. area in the xy plane.

It will be understood that the electrodes can be made of any suitable conductors, including Au, Cu, Al, Mg, Zn, Pd, Pt or alloys of these conductors or further elements.

Referring to FIG. 9D, this illustrates in plan view one of the nanowires 10 of FIG. 9C, which incidentally is illustrated with coincident pairs of outward notches 12. The pillars 13$_1$ and 13$_2$ are arranged on either side of the illustrated nanowire 10 passing the notches 12. In the drawing, the "C" electrodes are being actuated, inducing parallel currents I$_1$ and I$_2$ to flow down the pillars and induce cylindrical magnetic fields B$_1$ and B$_2$ at a distance equal to half the nanowire periodicity in the x-direction, as schematically shown by the circular field lines. In the nanowire, the fields B$_1$ and B$_2$ combine to produce a net field ΣB along the nanowire, i.e. in the y-direction, illustrated by the solid arrows. The net field ΣB when coincident with and superposed on the operating field H provides the required depinning field to render domain walls mobile out of the notches 12. In this way, domain walls can be moved along the nanowires from notch to notch in a controlled manner.

It will be understood that the current flowing in the electrodes that induces the net magnetic field in the vicinity of the notches will also produce heating and this effect may cooperate with the magnetic field effect so that both contribute to the depinning energy.

Current flow in the z-direction is thus used to induce a depinning field in the y-direction. It will be appreciated that a depinning field along the y-direction could also be produced with current flow in the x-direction, i.e. with electrodes extending in the planes of the non-magnetic layers 22.

Figure 10A:
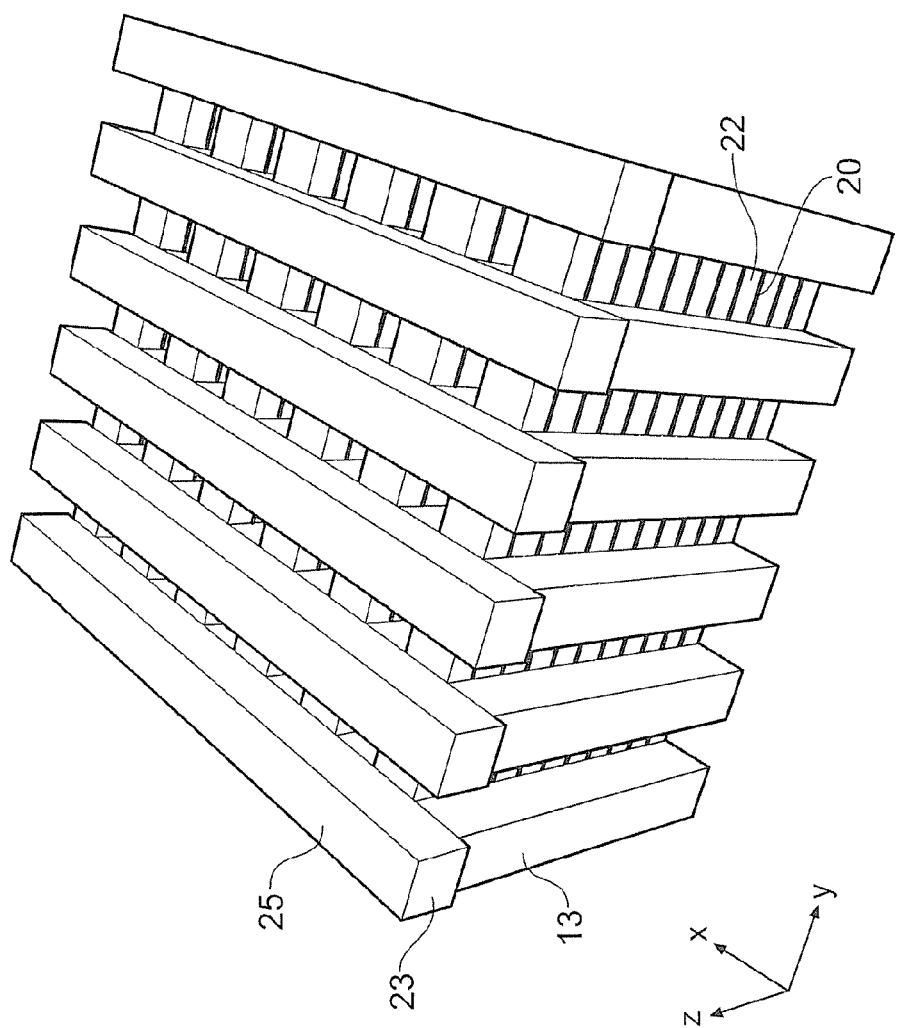
FIG. 10A is a schematic perspective view from above of the same parts of the memory device as shown in FIGS. 8 and 9A.
Figure 10B:
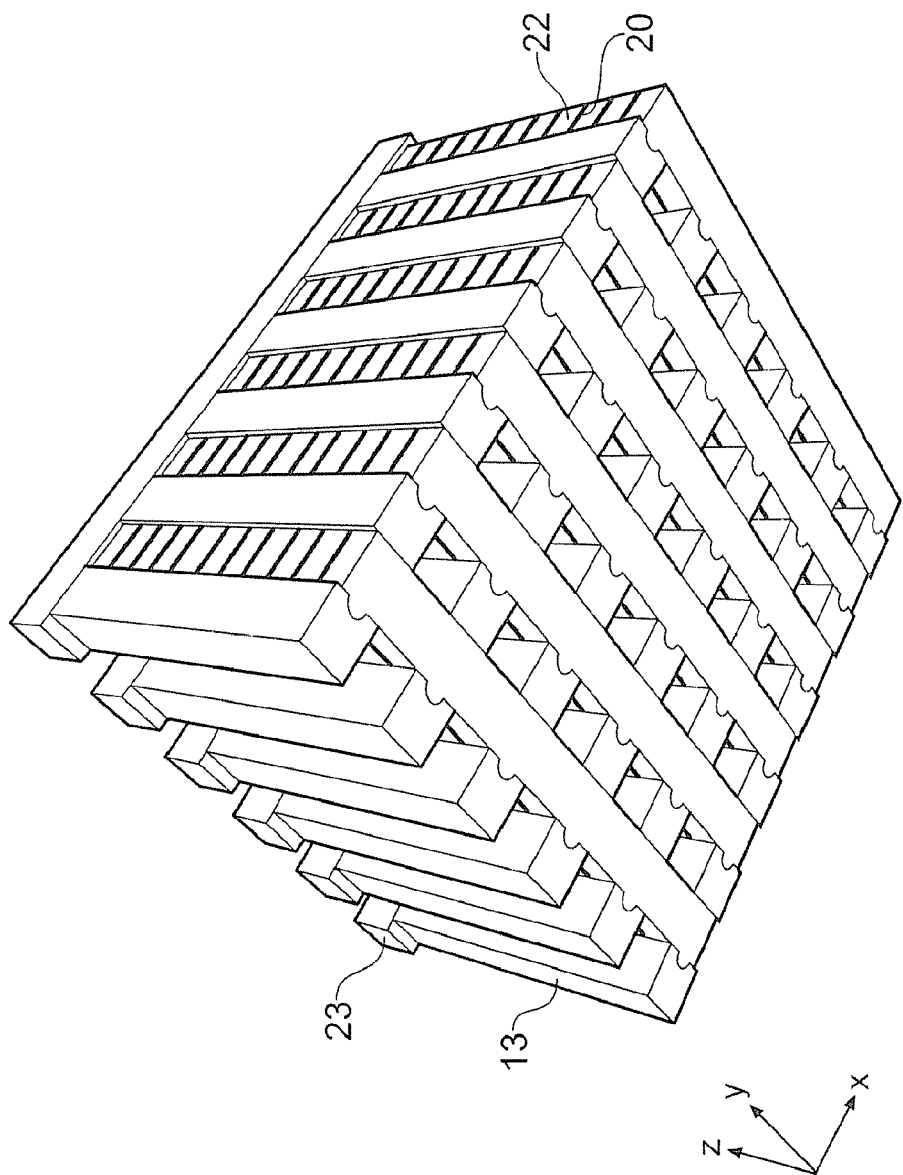
FIG. 10B is a schematic perspective view from below of the same parts of the memory device as shown in FIGS. 8 and 9A.

FIGS. 10A and 10B are schematic perspective view from above and below of the same parts of the memory device as shown in FIGS. 8 and 9A. The heating electrodes 25 each comprising a cross-member 23 and a set of pillars 13 are visible, wherein the heating electrodes separate the stacks of the alternating nanowires 20 and spacers 22. In this example, air gap shafts are formed between adjacent stacks in the x-direction and adjacent heating electrodes 25 in the y-direction. In FIG. 10B, an outward notch structure is visible, albeit in the bottom spacer layers 22, not the magnetic layers 20.

Figure 11:
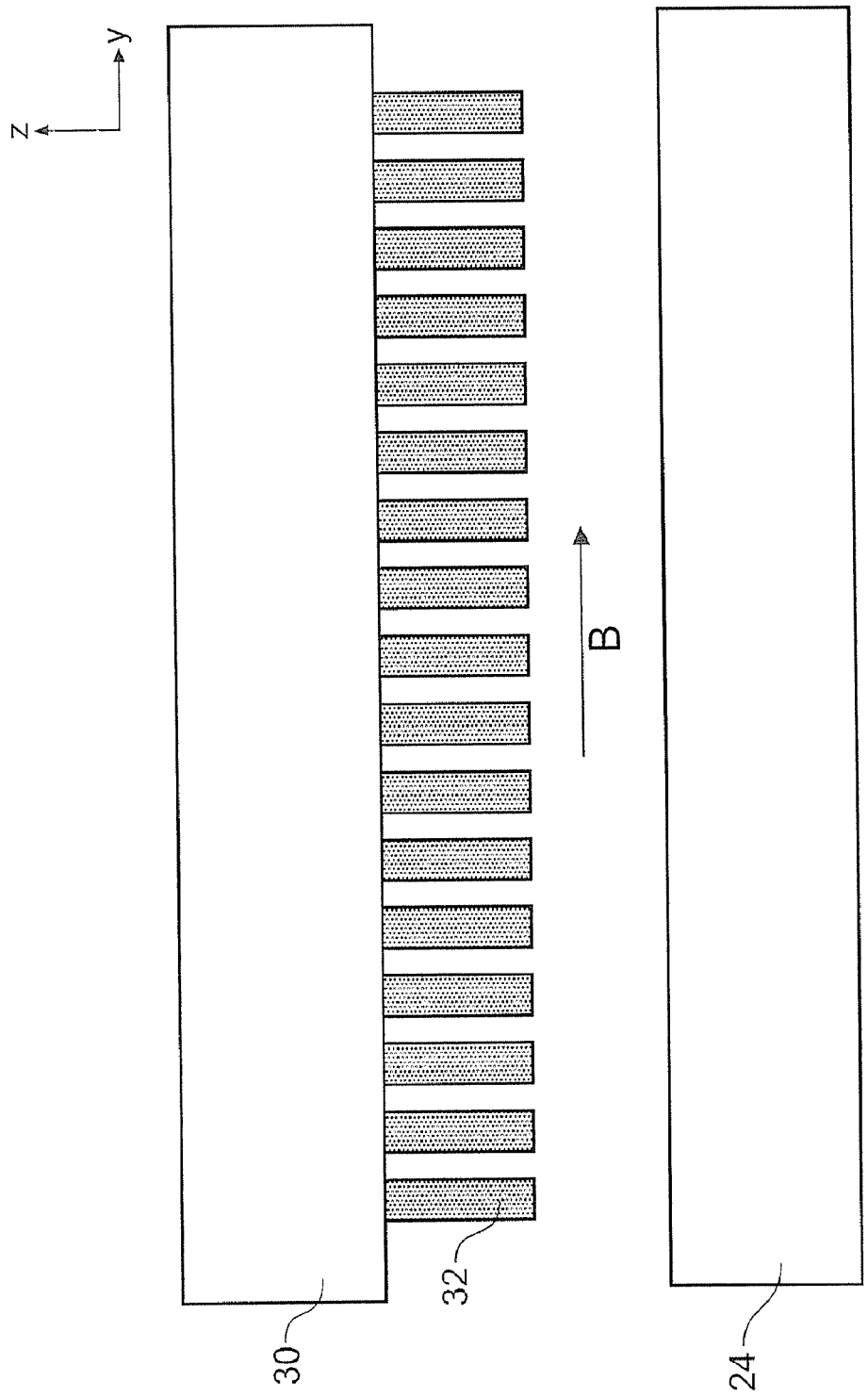
FIG. 11 is a schematic side section view of a magnetic field source for a memory device embodying the invention in the yz plane.

FIG. 11 is a schematic side section view of a magnetic field source 30 for a memory device embodying the invention in the yz plane. The substrate 24 which bears the previously described nanowire array and associated read-in and read-out elements is also shown. The source 30 provides an alternating linear magnetic field B in the +y and −y-directions depending on the current flow direction through the source. The field direction indicated in the figure is +y by way of example. The source is of the well known strip line design with an array of elements 32 extending in the z-direction. The source 30 may be integrated with the substrate 24 through flip chip bonding or other techniques.

FIGS. 12A and 12B are schematic side section views showing fabrication of an input side of a memory device embodying the invention in the yz plane. Generally speaking, an edge portion of a shadow mask 34 is used to define the end terminations of the pairs of nanowire and non-magnetic layers 20, 22 and is advanced in increments between deposition of each pair of layers by an amount 's' in the y-direction. The advances will typically be kept constant, but in principle these could be varied from step to step if desired.

FIG. 12A shows deposition of the first pair of nanowire and non-magnetic layers $20_1$, $22_1$ in which the shadow mask edge portion 34 is in a first position. It will be appreciated that the ends of the nanowires in layer $20_1$ will not be precise ends in the xz plane normal to the y-direction but rather may well have some tapering caused by penumbra shadowing or other effects at the edge of the shadow mask and as a result of the separation in z between the substrate and the mask.

After deposition of the first pair of layers $20_1$, $22_1$, the shadow mask is advanced by a distance 's' and a second pair of layers $20_2$, $22_2$ is deposited.

FIG. 12B illustrates this deposition of the second pair of nanowire and non-magnetic layers $20_2$, $22_2$ in which the shadow mask 34 is in a second position. It will thus be understood how a succession of many pairs of layers can be formed to create a 2D nanowire array of nanowires extending in the y-direction with steps of width 's' in the y-direction separating each nanowire layer.

The previously described data input electrodes 26 are then fabricated, but are not shown in the present figures.

FIGS. 13A and 13B are comparable schematic side section views to FIGS. 12A and 12B showing the other ends of the nanowires, namely the data output end of the memory device. These figures are in the yz plane, the same as FIGS. 12A and 12B. It will be understood that FIG. 13A is showing the same instant in time as FIG. 12A. Similarly, FIG. 13B is showing the same instant in time as FIG. 12B. At this end of the structure, a shadow mask edge portion 36 is also used which may be part of the same shadow mask as used to define the terraces on the input side, or part of an independent separate shadow mask. Like the data input side shadow mask it is advanced in increments in the +y-direction between deposition of successive pairs of layers 20, 22. The advance distance is shown as being of distance 'r' in the y-direction. This may be different for each step if desired, although it is envisaged that it will be held constant for ease of design. Moreover, the step size 'r' may be the same as 's' (e.g. if the shadow masks edge portions 34 and 36 are part of the same mask structure) or different. They can be different, since the choice of y separation of adjacent data input electrodes 26 may be independent of the choice of y separation of the magnetic detectors at the data output end. In any case, the advance distance 'r' defines the extent in the y-direction of the steps or terraces between the ramps that are created by the successive termination of the nanowires in each layer in turn, starting from the bottom nanowire layer.

Figure 14A:
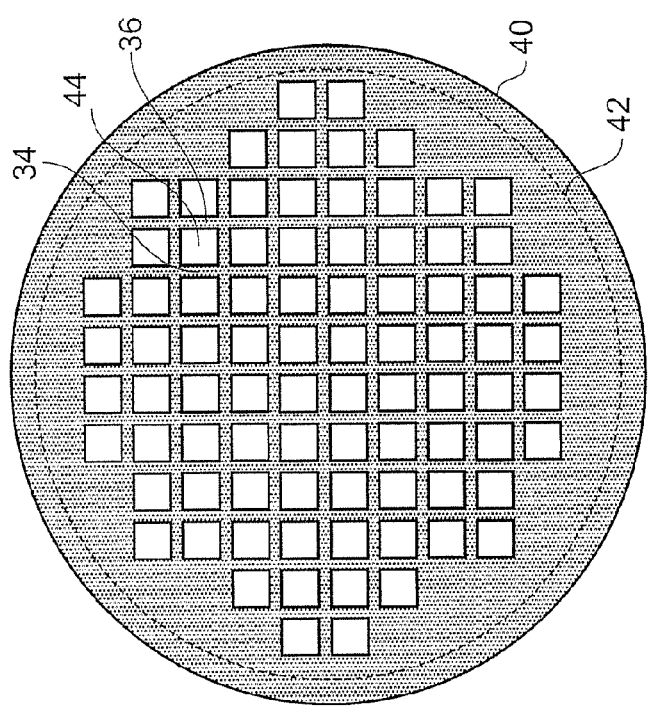
FIG. 14A is a schematic plan view in the xy plane of a shadow mask and wafer used in the fabrication process.
Figure 14B:
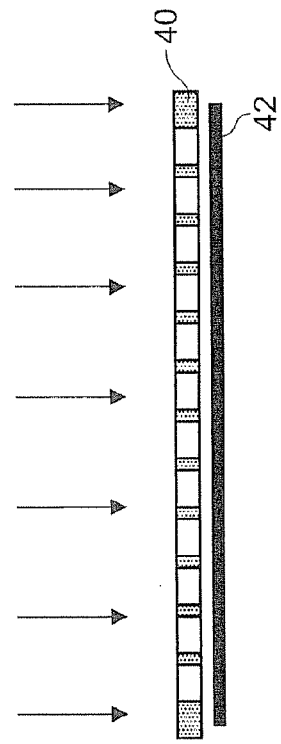
FIG. 14B is schematic side view in the zy plane of the same features as FIG. 14A.

FIG. 14A is a schematic plan view in the xy plane of a shadow mask 40 and an underlying wafer 42 used in the fabrication process, and FIG. 14B is a corresponding schematic side view in the zy plane. The mask 40 is generally of circular shape to match the shape of a wafer 42 of the desired diameter. The mask 40 has an array of apertures or holes 44 distributed over the mask 40 which are illustrated as being generally square, but may be rectangular or any other shape with well defined leading and trailing edge portions as viewed in the y-direction to form the mask end portions 34 and 36 respectively described further above. The apertures are illustrated highly schematically and it will be appreciated that they may each have a more complex structure to provide conventional lithography features. As described further above, the mask will be moved in stepwise fashion in the y-direction during fabrication to allow fabrication of the terraced structure of the device through deposition of material flux in the −z-direction as schematically illustrated by the downward arrows in FIG. 14B.

For fabrication, the mask will be mounted a short distance, e.g. approximately 200 microns, above the surface of the wafer and moved in the y-direction using a linear motor in vacuum during the deposition. In the simplest case there will be one set of terraces on one edge of each die for data input and another set of terraces on the other edge of each die for data output. The shadow mask can either be made by micromachining a silicon wafer such that there are etched holes in it defined by photolithography, or by traditional mechanical machining of a thin metal plate. A given mask can be used for the production of several wafers. The lifetime limit of a mask will be determined by build-up of deposited material on the edges of the apertures in the mask, causing them to become roughened.

If it is desired to sector the serial data in such a way that the magnetic nanowires do not run across the full width of the die, then several apertures will be needed in the shadow mask for each die, to allow a separate set of input and output terraces for each data sector. Once the terraced multilayer film has been deposited, the wafer is coated with photoresist and lines defining the magnetic nanowires exposed, developed and etched in the normal photolithography process. The photomask needs to define magnetic nanowires that are long enough to completely traverse all of the steps in the terrace.

A further embodiment is now described in which the pinning sites are created by crosses formed between the nanowires conveying and storing the data and further nanowires coplanar therewith and extending transverse thereto. It is known that magnetic nanowire crosses can be used to form pinning sites [10].

Figure 15A:
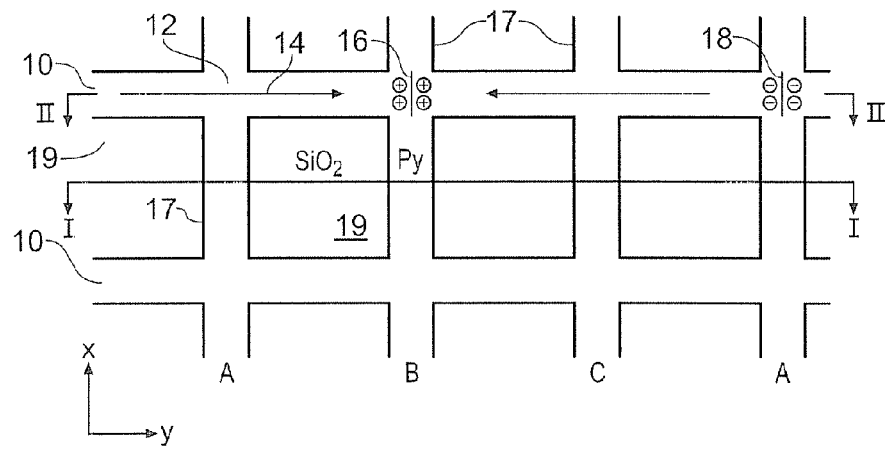
FIG. 15A is a schematic plan view of a section in the xy plane through the nanowires showing a central part of a memory device according to a further embodiment.
Figure 15B:
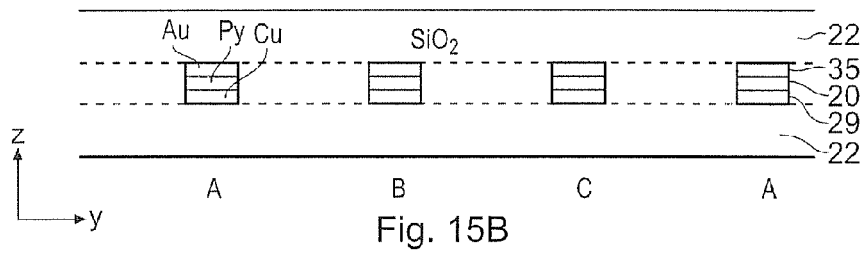
FIG. 15B is a schematic side view in the yz plane of a vertical section through plane I-I of FIG. 15A.

FIG. 15A is a schematic plan view of a section in the xy plane through the nanowires of this further embodiment showing a central part of a memory device. FIG. 15B is a schematic side view in the yz plane of a vertical section through one of the nanowires of FIG. 15A. Reference numerals relating to features corresponding to the previous embodiments are retained unchanged.

Referring to FIG. 15A, there is shown highly schematically two adjacent nanowires 10 extending in the y-direction which are indicated as being made of Permalloy by way of example. The nanowires 10 support magnetic domains 14 bounded by head-to-head and tail-to-tail domain walls 16 and 18 respectively. In the figure, example domains and domain walls are schematically illustrated only in one of the nanowires. Pinning sites 12 are arranged regularly spaced along the nanowires 10 and are subdivided into three groups A, B and C in repeating sequence. Each group of pinning sites being independently addressable by electrodes (not shown in this figure), but all the pinning sites in the same group being commonly addressed, as in the previous embodiments.

In the present embodiment, the pinning sites 12 are formed by crosses of magnetic material formed by further nanowires 17 having similar cross-sectional dimensions and physical properties to the nanowires 10. The further nanowires 17 extend in the x-direction orthogonal to the nanowires 10, crossing multiple ones of the nanowires 10, thereby collectively forming a grid pattern. The nanowires 10 and further crossing nanowires 17 are co-planar and fabricated together as a single deposited layer, wherein the magnetic material is separated by islands of non-magnetic material 19, such as $SiO_2$ for example. Standard lithographic techniques can be used to etch a grid in a, for example, $SiO_2$ layer followed by deposition of the magnetic material, for example, Py, and lift off of the excess Py that covers the $SiO_2$ islands to complete the illustrated structure. Not only is the magnetic material deposited into the grid trenches, but also electrode material as explained with reference to the following figures.

Figure 15C:
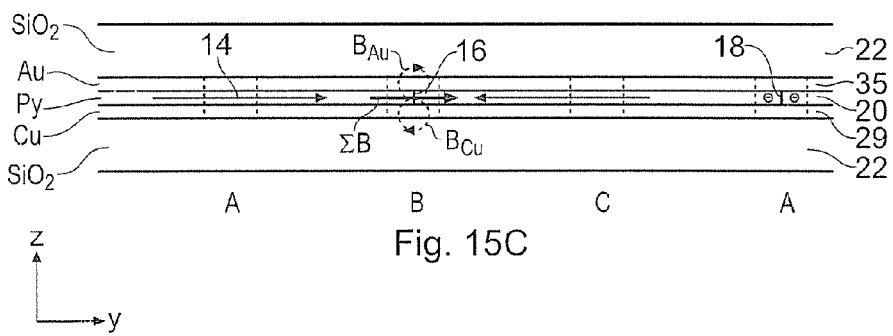
FIG. 15C is a schematic side view in the yz plane of a vertical section through plane II-II of FIG. 15A.

FIGS. 15B and 15C are schematic side views in the yz plane of a vertical section through the planes I-I and II-II of FIG. 15A respectively.

The section of FIG. 15B shows that the magnetic material layer 20, e.g. Py, is sandwiched between lower and upper electrode material layers 29 and 35, the example of copper and gold layers below and above a Permalloy layer being illustrated. The remaining area of this section is non-magnetic material, such as $SiO_2$, being made up of the islands 19 visible in FIG. 15A and upper and lower layers 22 of non-magnetic material which separate vertically adjacent magnetic layers 20 in the same way as described further above in relation to the preceding embodiments.

The section of FIG. 15C is through one of the nanowires 10 and thus shows a continuous layer of magnetic material 20 extending in the y-direction with continuous layers 29 and 35 of electrode material co-extending in the y-direction.

The electrodes are driven by applying a voltage difference to the ends of the crossing nanowires 17 of each group A, B, C, to induce current flow in that group of electrodes in the x-direction. It is noted that with this arrangement, there will be a relatively insignificant current induced to flow between adjacent crossing wires along sections of the nanowires 10, sometimes referred to as sneak currents in the art. The sneak currents are not considered in the following, and will not affect device performance so long as they are not large enough to induce depinning.

The vertically adjacent pairs of upper and lower electrodes which sandwich each crossing nanowire are driven by a common signal, and consequently form parallel resistors in which the current $I_1$ flowing down the upper electrode 35 will be $R_2/(R_1+R_2)$, where $R_1$ and $R_2$ are the resistances of upper and lower electrodes 35 and 29 respectively. Similarly, current $I_2$ flowing down the lower electrode 29 will be $R_1/(R_1+R_2)$. For example, if the upper and lower electrodes are made from Au(gold) and Cu(copper) as illustrated, then more current will flow down the copper electrodes than the gold electrodes by virtue of the lower resistivity of copper.

As is well known from the Biot-Savart law, a current travelling down a straight wire induces a magnetic field with cylindrical symmetry field lines, wherein the field at any point away from the wire has a magnitude proportional to the current and inversely proportional to the distance from the wire. Consequently, for two parallel wires with different currents flowing through them, there is a net magnetic field parallel to the wires mid-way between them.

It will be understood that the illustrated electrode arrangement of the present embodiment is an example of this situation. The illustrated example is taken of actuation of the B group of electrodes by a drive signal to induce current flow. Field lines of the upper and lower layers of the illustrated B electrodes are shown by the circles labelled $B_{Au}$ and $B_{Cu}$, and the resultant net magnetic field $\Sigma B$ in the plane midway between the upper and lower electrodes by the arrow extending through the head-to-head domain wall 16 in the y-direction.

It will thus be understood how the domain walls 16 and 18 can be selectively moved through the nanowires 10 from cross to cross under the actuation of the electrodes 29 and 35 as described further above in relation to FIG. 1 and FIG. 5. Namely, when electrodes of the A, B or C groups are actuated in synchrony with the main operating field H, the induced field $\Sigma B$ is sufficient to depin domain walls from the crosses, whereupon the affected domain walls move along the nanowire 10 to the next cross, where they become pinned ready for the next actuation.

The upper and lower electrode layers 35 and 29 are formed at the same time as the magnetic layer 20, wherein the three layers are deposited in sequence into the trenches that have been etched to form the grid structure evident in FIG. 15A. After deposition of the three layers 29, 20 and 35, the unwanted material outside the trenches can then be removed by lift off of the photoresist to complete the illustrated structure.

It will be understood that the electrodes can be made of any suitable conductors, including Au, Cu, Al, Mg, Zn, Pd, Pt or alloys of these conductors or further elements.

It will be understood that in the above example the upper and lower electrodes have the same lengths and cross-sections, and the different materials are used to provide the different electrical resistivities of the upper and lower electrodes. The relevant parameter is of course that the electrodes of the two types have different electrical resistivities, and this is also affected by the dimensions of the electrodes. For example, the electrodes could all be made of the same material, but have different thicknesses in the z-direction. This can be achieved by depositing different thicknesses of electrode material when forming the upper and lower electrodes.

All of the electrodes in a common xz plane are contacted at either side of the 3D structure by side contacts (not shown). All of the "A" electrode side contacts are connected in parallel to each other so that they can be commonly driven. All of the "B" and "C" electrode side contacts are similarly connected.

Although the embodiments above have been described in considerable detail, numerous variations and modifications will become apparent to those skilled in the art once the above disclosure is fully appreciated.

For example, the terminations of the nanowires at the data input side of the device need not be as shown in FIG. 6, but could instead be similar to the read out structure shown in FIG. 7, with the field generating electrodes 26 being embedded in or otherwise integrated with the semiconductor substrate. To achieve this with a shadow mask fabrication process for the layer deposition, it would be preferable also to reverse the read out side fabrication, so that the read out structure would become similar to the read in structure shown in FIG. 6 with the magnetic detectors arranged on top of the terraces rather than below them.

Moreover the magnetic field generator need not be arranged above the magnetic nanowire structure, i.e. above the substrate. It could instead be arranged below the substrate, for example bonded to the underside of the substrate, which may be etched away to allow the magnetic field generator to be arranged closer to the nanowire array.

The distance that the generated magnetic field will remain homogenous in strength above a field generating chip is roughly equal to the lateral size of the chip itself. So if there is a 1 cm square field generator chip, as long as the storage layers are within approximately 1 cm of the surface of the field generator, field intensity will be maintained. In this case, it would be easy to fix the field generator underneath the storage chip. However, it is not necessary to activate all of the nanowires at a given time. Rather, the data storage can be sectored so that only the sector containing the file of interest is shifted. This allows the field generator to be segmented, so that it is not necessary to energize the entire generator, thus dramatically reducing power dissipation. However, the effective size of the generator is now reduced, and consequently the field generator chip must approach the storage chip more closely. Whether the field generator can be placed underneath the storage chip or not should be decided dependent upon how finely the sectoring has been done, and hence there is a trade-off between manufacturing precision and power dissipation.

It will be appreciated that the above-described structure is a FIFO type serial memory. However, it is also possible in principle to make a FILO type memory if the read-in and read-out elements are both at the same end of the nanowires. For example the magnetic detectors could be arranged under the nanowire terraces on the input side of the device. In this case, the structure need only have terracing on one side.

It is intended that the following claims be interpreted to embrace all such variations and modifications as well as their equivalents.

What is claimed is:

1. A serial data storage device comprising:
   a substrate;
   an array of nanowires of magnetic material arranged in three-dimensions on the substrate, wherein the nanowires extend in the y-direction and are spaced apart from each other in the x- and z-directions forming a stack of nanowire layers, wherein each nanowire is formed so as to be capable of supporting single magnetic domains along its length, the magnetic domains being separated by domain walls, wherein the nanowires have a plurality of domain wall pinning sites along their length;
   a magnetic field source arranged to generate an operating field capable of moving the domain walls along the nanowires between the pinning sites by action of a component that alternates between alignment and anti-alignment with a first direction along the nanowire; and
   a depinning signal generator arranged to alternately apply a depinning signal to pinning sites hosting head-to-head and tail-to-tail domain walls in synchrony with the alignment and anti-alignment of the operating field component with the first direction, thereby to move magnetic domains along the nanowire in the first direction by alternate movement of the head-to-head and tail-to-tail domain walls.

2. The device of claim 1, wherein the pinning sites are created by dimensional variations along the nanowires.

3. The device of claim 2, wherein the dimensional variations are local narrowing or widening features in the nanowires to create inward or outward notches.

4. The device of claim 3, wherein the local narrowing or widening features are formed on opposing sides of the nanowire to provide coincident local narrowing or widening features.

5. The device of claim 1, wherein the pinning sites are created by crosses formed between said nanowires extending in the y-direction and further nanowires extending in the x-direction.

6. The device of claim 1, wherein the depinning signal generator comprises first, second and third groups of electrodes, and wherein the depinning signal generator is operable to selectively actuate the first, second and third groups of electrodes.

7. The device of claim 6, wherein the depinning signal generator is operable to selectively actuate the first, second and third groups of electrodes with a current to cause local heating of the pinning sites.

8. The device of claim 7, wherein the depinning signal generator is operable to apply the depinning signal as a first voltage applied to one of the groups of electrodes and a second voltage applied to the other groups of electrodes so that the current flowing through the electrode group to which the first voltage is applied is greater than that flowing through the other electrode groups, thereby preferentially heating the electrode group to which the first voltage is applied.

9. The device of claim 6, wherein each electrode group comprises first electrode elements and second electrode elements that pass either side of the pinning sites, and wherein the depinning signal generator is operable to generate first and second currents of different magnitudes through the first and second electrode elements so that a net magnetic field is generated along the nanowires to provide the depinning signal.

10. The device of claim 9, wherein the first and second electrode elements have different electrical conductivities, so that the first and second currents can be generated with a common drive signal.

11. The device of claim 1, further comprising a plurality of nucleation field generators, one for each nanowire, arranged to selectively create new magnetic domains in the nanowires by locally applying a field of at least the nucleation field at a read-in location.

12. The device of claim 1, further comprising a data input side formed by a plurality of terraces extending in the x-direction formed by stepwise termination of each nanowire layer.

13. The device of claim 12, wherein the nanowire layer that terminates to form each terrace is in each case the lowermost nanowire layer.

14. The device of claim 12, wherein the nanowire layer that terminates to form each terrace is in each case the uppermost nanowire layer.

15. The device of claim 1, further comprising a plurality of magnetic field detectors, one for each nanowire, arranged to measure the magnetic field of the nanowires at a read-out location.

16. The device of claim 1, further comprising a data output side formed by a plurality of terraces extending in the x-direction formed by stepwise termination of each nanowire layer.

17. The device of claim 16, wherein the nanowire layer that terminates to form each terrace is in each case the lowermost nanowire layer.

18. The device of claim 16, wherein the nanowire layer that terminates to form each terrace is in each case the uppermost nanowire layer.

19. The device of claim 12, further comprising a data output side formed by a plurality of terraces extending in the x-direction formed by stepwise termination of each nanowire layer, and wherein the data input and output side terraces associated with the same nanowire layer have the same extent in the y-direction.

20. A method of serially storing data encoded in magnetic domains in a nanowire, each magnetic domain being bounded by a head-to-head domain wall and a tail-to-tail domain wall, and the nanowire having a plurality of domain wall pinning sites along its length, the method comprising:
   (a) applying an operating field having a component that alternates between alignment and anti-alignment with a first direction along the nanowire; and
   (b) alternately applying a depinning energy to pinning sites hosting head-to-head and tail-to-tail domain walls in synchrony with the alignment and anti-alignment of the operating field component with the first direction, so that the magnetic domains are moved along the nanowire in the first direction by alternate movement of the head-to-head and tail-to-tail domain walls.

21. The method of claim 20, further comprising:
   (c) selectively creating new magnetic domains in the nanowire by locally applying a field of at least the nucleation field at a read-in location, while carrying out steps (a) and (b), thereby reading in data serially into the nanowire in the first direction.

22. The method of claim 21, wherein the read-in location is at an end portion of the nanowire associated with the nanowire end away from which the domain walls are moved in the first direction.

23. The method of claim 20, further comprising:
(d) repeatedly measuring the magnetic field of the nanowire at a read-out location, while carrying out steps (a) and (b), thereby reading out data serially from the nanowire in the first direction.

24. The method of claim 23, wherein the read-out location is at an end portion of the nanowire associated with the nanowire end towards which the domain walls are moved in the first direction.

25. The method of claim 20, further comprising:
(e) alternately applying a depinning energy to pinning sites hosting head-to-head and tail-to-tail domain walls in synchrony with the anti-alignment and alignment of the operating field component with the first direction, so that the magnetic domains are moved along the nanowire in a second direction, opposite to the first direction, by alternate movement of the head-to-head and tail-to-tail domain walls.

26. The method of claim 25, further comprising:
(f) repeatedly measuring the magnetic field of the nanowire at a read-out location, while carrying out steps (a) and (e), thereby reading out data serially from the nanowire in the second direction.

27. The method of claim 26, wherein the read-out location is at a nanowire end towards which the domain walls are moved in the second direction.

28. The method of claim 20, wherein the depinning energy is applied by electrically induced heating.

29. The method of claim 20, wherein the depinning energy is applied using electrode elements that pass either side of the domain wall pinning sites in a direction transverse to the nanowire, and by generating currents of different magnitude along the electrode elements to induce a net magnetic field along the nanowire.

30. A method of injecting, storing and reading out serial data streams using nanowires of magnetic material capable of supporting single magnetic domains along their length, wherein the nanowires have a plurality of domain wall pinning sites along their length, each nanowire being formed so that a domain wall is mobile along the nanowire under action of an operating field having a strength between the propagation field for the nanowire and a locally enhanced propagation field at the pinning sites, the method comprising:
applying the operating field to render domain walls mobile in the nanowire between adjacent pinning sites, wherein the nanowire is activated while the operating field is being applied;
selectively injecting domain walls into the nanowire at an injection location by applying a local magnetic field of at least the nucleation field at the injection location, wherein the domain walls or the magnetic domains defined by them are used to encode data;
moving the injected domain walls along the nanowire away from the injection location in a stepwise fashion from one pinning site to the next by applying depinning energy to selected ones of the pinning sites while the nanowire is activated so as to temporarily lower the locally enhanced propagation field at the selected pinning sites to below the operating field; and
measuring magnetic field of the nanowire at least one read location on the nanowire to read the data encoded by the domains or domain walls.

* * * * *

Disclaimer

7,710,770 B2 — Russell Paul Cowburn, Gerrards Cross (GB); Dorothee Petit, London (GB); Dan Read, London (GB); Oleg Petracic, Oberhausen (DE). DATA STORAGE DEVICE AND METHOD. Patent dated May 4, 2010. Disclaimer filed July 15, 2013, by the assignee, Ingenia Holdings UK Limited.

Hereby disclaim complete claims 1-30 of said patent.

*(Official Gazette, December 24, 2013)*